United States Patent
Lam et al.

(10) Patent No.: US 11,483,007 B1
(45) Date of Patent: Oct. 25, 2022

(54) MULTIPLE CLOCK DOMAIN ALIGNMENT CIRCUIT

(71) Applicant: Ciena Corporation, Hanover, MD (US)

(72) Inventors: Jerry Yee-Tung Lam, Stittsville (CA); Douglas Stuart McPherson, Ottawa (CA); Robert Gibbins, Stittsville (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 14 days.

(21) Appl. No.: 17/355,821

(22) Filed: Jun. 23, 2021

(51) Int. Cl.
*H03M 1/12* (2006.01)
*H03M 1/74* (2006.01)
*H03M 1/66* (2006.01)

(52) U.S. Cl.
CPC .......... *H03M 1/123* (2013.01); *H03M 1/662* (2013.01); *H03M 1/74* (2013.01)

(58) Field of Classification Search
CPC ......... H03M 1/123; H03M 1/662; H03M 1/74
USPC ........................................................ 341/141
See application file for complete search history.

(56) References Cited

U.S. PATENT DOCUMENTS

| | | | |
|---|---|---|---|
| 6,894,551 B2* | 5/2005 | Johnson | H03K 5/15013 327/295 |
| 7,616,042 B2* | 11/2009 | Suzuki | H03K 5/15066 327/256 |

OTHER PUBLICATIONS

Maxim Integrated Products, Inc. "Synchronizing Multiple High-Speed Multiplexed DACs for Transmit Applications", APP 3901, Sep. 21, 2006, https://www.maximintegrated.com/en/design/technical-documents/app-notes/3/3901.html.

* cited by examiner

*Primary Examiner* — Khai M Nguyen
(74) *Attorney, Agent, or Firm* — Young Basile Hanlon & MacFarlane, P.C.

(57) ABSTRACT

Described are apparatus and methods to calibrate and align multiple high-speed clock domains. A system includes at least two clock domains, a launch circuit connected to each of the at least two domains, and a calibration circuit. Each clock domain including a resettable device having a local reset retime clock. The launch circuit aligns a reset pulse with the local reset retime clock by using a launch clock from one of the domains, where the reset pulse is incoherent with respect to the domains, adjusts a delay of the launch clock to control a launch time of the reset pulse, and sends the reset pulse based on the delayed launch clock. The calibration circuit samples a local reset retime delayed clock to generate a readback signal. The launch circuit and the calibration circuit iterate through selected delays until safe arrival timing is indicated from each readout.

20 Claims, 17 Drawing Sheets

MULTIPLE CLOCK DOMAIN ALIGNMENT CIRCUIT

TECHNICAL FIELD

This disclosure relates to alignment of multiple clock domains. More specifically, this disclosure relates to a circuit to calibrate and align multiple high-speed clock domains.

BACKGROUND

High-speed circuits such as digital-to-analog converters (DACs) and analog-to-digital converters (ADCs) require high-speed clocks for alignment purposes. Each channel in a multiple channel DAC or ADC can have a clock domain. Each of these clock domains need to be aligned with respect to each other for proper functionality.

In some instances, high frequency alignment clock signals are continuously sent to generate the required clocks in each clock domain. The DACs and ADCs generally use clock frequencies which are lower than the high frequency alignment clock signals. Clock dividers are used to generate the lower frequency clocks for the DACs and the ADCs. However, clock dividers introduce alignment errors at the DAC or ADC. An issue with clock dividers is start-up phase ambiguity. Clock dividers are finite state machines triggered by the input high frequency clock. The clock dividers can start-up in one of multiple states, each state being equally valid. This can lead to the clock domains being misaligned on power up. Consequently, the dividers in each channel need to be reset.

There are other techniques for aligning clock domains but each has issues. One technique includes aligning clock domains by using low frequency clocks and clock multipliers instead of dividers. However, the use of clock multipliers to avoid the use of high-speed clock dividers is difficult due to the very high multiplication ratios required, with potential design and performance implications.

Another technique uses a reset signal for low frequency clock domains. Although reset signals are common for low frequency clock domains, the difficulty increases as the clock frequency increases. The margin of error to align all of the clocks decreases as the clock frequency increases, and small variations in delay due to process, voltage or temperature shifts increases.

Another technique includes characterizing delay paths and choosing clock phases based on expected nominal extracted and process behavior. However, the process spread (both in routing delay and process corner variation) has increased while clock frequency has increased. For high frequency clock domains, the expected range of variation can easily exceed the available timing margin to be able to fix the clock distribution to an expected nominal value.

Another technique uses a global sample scope to detect misalignment and using phase rotators to shift clocks for alignment. Using global sample scope assumes channel-channel delay matching, and is a time consuming measurement process, either in the lab or if done in firmware. Spinning phase rotators is a viable solution but requires significant time and continuous measurement to ensure alignment. Significant firmware integration required. Another technique uses alignment circuits to compare clocks once they are brought to a central location. Comparing clocks at a central location requires clocks to be distributed centrally (consuming power), and relies on good matching between paths.

Another technique uses feeding states of one clock domain to other clock domains. Delivering clock phases from one domain to another in a leader-follower arrangement requires distribution of clocks over a long distance (consuming power) and is subject to limited timing margin. As the clock frequency increases and as the distance increases, the timing margin to deliver the clock decreases.

SUMMARY

Described herein are apparatus and methods to calibrate and align multiple high-speed clock domains.

In implementations, a high-speed multi-channel device includes multiple processing channels. Each channel including a divider for dividing down a frequency clock from a frequency clock bus, and a reset unit configured to reset the divider. A clock input of the reset unit connected to a reset retime clock from the frequency clock bus. The high-speed multi-channel device further includes a reset launch circuit configured to receive a reset pulse, receive a reset launch clock from one of the multiple processing channels, the reset launch clock configured to make coherent the reset pulse and the reset retime clock, apply a launch phase value to the reset launch clock to generate a delayed reset launch clock, the launch phase value configured to control a launching of the reset pulse, and launch the reset pulse based on the delayed reset launch clock. The high-speed multi-channel device further includes multiple arbiters, one for each channel of the multiple processing channels, each arbiter configured to send a readback signal based on sampling a reset retime delayed clock using the launched reset pulse. The reset launch clock and the multiple arbiters iterate through launch phase values until readback signals from each of the multiple arbiters reports safe arrival timing of the launched reset pulse at a respective reset unit.

In implementations, the reset launch circuit includes a variable delay unit configured to apply a selected launch phase value to the reset launch clock. In implementations, the multiple arbiters each send the readback to a control unit. In implementations, the reset launch circuit includes a variable delay unit configured to receive a launch phase value selection signal from a control unit based on processing the readback signals. In implementations, the reset launch circuit includes a reset launch unit connected to the variable delay unit, the reset launch unit configured to launch the reset pulse. In implementations, the high-speed multi-channel device further includes a sample scope circuit configured to obtain samples at an input and at a clock input of the reset unit for each channel, the samples determinative of whether the launching of the reset pulse is close to a sensitive edge of the reset retime clock. In implementations, the safe arrival timing indicates that the launching of the reset pulse is close to a sensitive edge of the reset retime clock. In implementations, unsafe arrival timing accounts for channel to channel frequency clock skew and setup and hold time. In implementations, the unsafe arrival timing uses a two-fold factor to establish an optimal timing margin. In implementations, each channel represents a different clock domain and the reset pulse is incoherent with respect to each different clock domain.

In implementations, a method for clock domain alignment in a multi-channel device includes initializing a variable delay unit with a default launch phase value to control a launching of a reset pulse, applying the default launch phase value to a launch clock to generate a delayed launch clock, wherein the launch clock synchronizes the reset pulse with a system clock, sending the reset pulse based on the delayed launch clock, for each channel, capturing a readback to check a timing difference based on the reset pulse and a reset retime clock, storing the default launch phase value when all readbacks indicate safe arrival timing signifying channel alignment, and iterating through different launch phase values until a launch phase value results in all readbacks indicating safe arrival timing.

In implementations, the method further includes sampling a reset retime delayed clock using the reset pulse to generate the readback, wherein a reset time clock aligns a divider in a channel with other dividers in other channels when all readbacks indicate safe arrival timing. In implementations, the method further includes sending each readback to a controller for analysis. In implementations, the method further includes receiving launch phase value selections based on analyzed redbacks. In implementations, the method further includes controlling a common-mode voltage by switching on/off resistors in a resistor ladder to change a duty cycle of the synthesized frequency clock. In implementations, the safe arrival timing indicates that the launching of the reset pulse is close to a sensitive edge of the reset retime clock. In implementations, an optimal timing margin is established by using a two-fold factor to account for channel to channel frequency clock skew and setup and hold time.

In implementations, a system includes at least two clock domains, each clock domain including a resettable device having a local reset retime clock, a launch circuit connected to each of the at least two domains, the launch circuit configured to align a reset pulse with the local reset retime clock by using a launch clock from one of the at least two domains, wherein the reset pulse is incoherent with respect to the at least two clock domains, adjust a delay of the launch clock to control a launch time of the reset pulse, the delay provided by a digital core, and send the reset pulse based on the delayed launch clock, and a calibration circuit configured to sample a local reset retime delayed clock to generate a readback signal, where the launch circuit and the calibration circuit iterate through selected delays until safe arrival timing is indicated from each readout.

In implementations, the safe arrival timing indicates that the launching of the reset pulse is close to a sensitive edge of the local reset retime clock. In implementations, the system further includes a sample scope circuit configured to obtain samples from each clock domain, the samples determinative of whether the launching of the reset pulse is close to a sensitive edge of the local reset retime clock.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
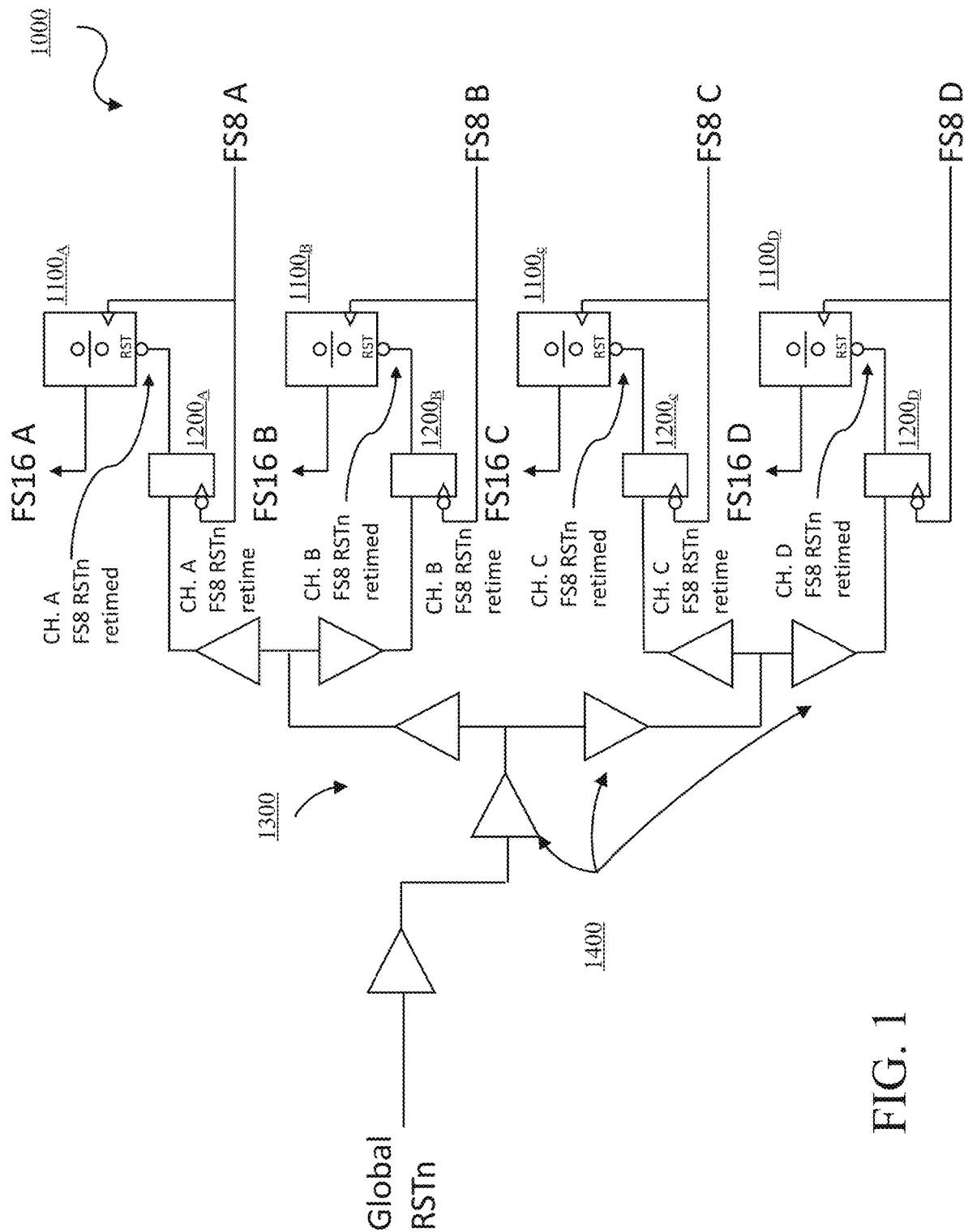
FIG. 1 is a block diagram of a high-speed multi-channel DAC including a clock generation circuit.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

FIG. 1 is a block diagram of a high-speed multi-channel DAC 1000. The high-speed multi-channel DAC 1000 can include four channels A, B, C, and D. Each channel includes a divider having a reset input connected to an output of a reset unit for each channel, namely, a divider $1100_A$, a divider $1100_B$, a divider $1100_C$, and a divider $1100_D$, and a reset unit 1200A, a reset unit $1200_B$, a reset unit $1200_C$, and a reset unit $1200_D$, respectively. The clock input of each of the reset unit 1200A, the reset unit $1200_B$, the reset unit $1200_C$, and the reset unit $1200_D$ is connected to a FS8 RSTn retime clock, namely, a CH. A FS8 RSTn retime clock, a CH. B FS8 RSTn retime clock, a CH. C FS8 RSTn retime clock, and a CH. D FS8 RSTn retime clock. The notation of "n" is to signify an inverted polarity. A "reset" signal is active high, i.e., resets the circuit when the signal is high, whereas a "resetn" (or "resetb") signal is active low, i.e., resets the circuit when the signal is low. The description and claims described herein are applicable to implementations using either logic state.

Each of the divider $1100_A$, divider $1100_B$, divider $1100_C$, and divider $1100_D$ has a clock input connected to a $\frac{1}{8}^{th}$ sampling frequency (FS)(FS8) clock, namely, a FS8 A clock, a FS8 B clock, a FS8 C clock, and a FS8 D clock. Each of the divider $1100_A$, divider $1100_B$, divider $1100_C$, and divider $1100_D$ can output a FS16 clock, namely, a FS16 A clock, a FS16 B clock, a FS16 C clock, and a FS16 D clock, from the FS8 A clock, FS8 B clock, FS8 C clock, and FS8 D clock. As is understood, the respective FS8 clocks and FS8 RSTn retime clocks are from respective FS8 clock busses, where the FS8 clocks and the FS8 RSTn retime clocks have different phases or temporally delayed with respect to each other.

A global reset pulse (Global RSTn) is connected via a reset clock tree 1300 to an input of each of the reset unit 1200A, the reset unit $1200_B$, the reset unit $1200_C$, and the reset unit $1200_D$. The reset clock tree 1300 can include delay units 1400 which are configured to match a main clock tree (not shown for convenience).

The CH. A FS8 RSTn retime, CH. B FS8 RSTn retime, CH. C FS8 RSTn retime, and CH. D FS8 RSTn retime each sample the Global RSTn to generate a FS8 RSTn retimed clock, namely, a CH. A FS8 RSTn retimed clock, a CH. B FS8 RSTn retimed clock, a CH. C FS8 RSTn retimed clock, and a CH. D FS8 RSTn retimed clock. The CH. A FS8 RSTn retimed clock, CH. B FS8 RSTn retimed clock, CH. C FS8 RSTn retimed clock, and CH. D FS8 RSTn retimed clock reset a state of the divider $1100_A$, divider $1100_B$, divider $1100_C$, and divider $1100_D$, respectively, so as to generate the FS16 A clock, the FS16 B clock, the FS16 C clock, and the FS16 D clock, respectively.

The Global RSTn signal is used to synchronize the dividers (divider $1100_A$, divider $1100_B$, divider $1100_C$, and divider $1100_D$) in all 4 channels, each channel being a separate clock domain. The mismatch between the delay paths (e.g., the reset clock tree 1300) for the Global RSTn signal and skew in the FS8 RSTn retime clocks (e.g., CH. A FS8 RSTn retime clock, CH. B FS8 RSTn retime clock, CH. C FS8 RSTn retime clock, and CH. D FS8 RSTn retime clock) between the channels can cause mismatch in locally retimed RSTn clocks (e.g., CH. A FS8 RSTn retimed clock, CH. B FS8 RSTn retimed clock, CH. C FS8 RSTn retimed clock, and CH. D FS8 RSTn retimed clock) if the Global RSTn arrives before the FS8 RST retime clocks for some channels and after the FS8 RST retime clocks for other channels. Since the Global RSTn is sent from an interface independent of the FS8 clock bus, i.e., the Global RSTn can be asynchronous with respect to a system clock (from where the FS8 and other related clocks are generated from), poor timing of the Global RSTn arrival is always a possibility.

Figure 2:
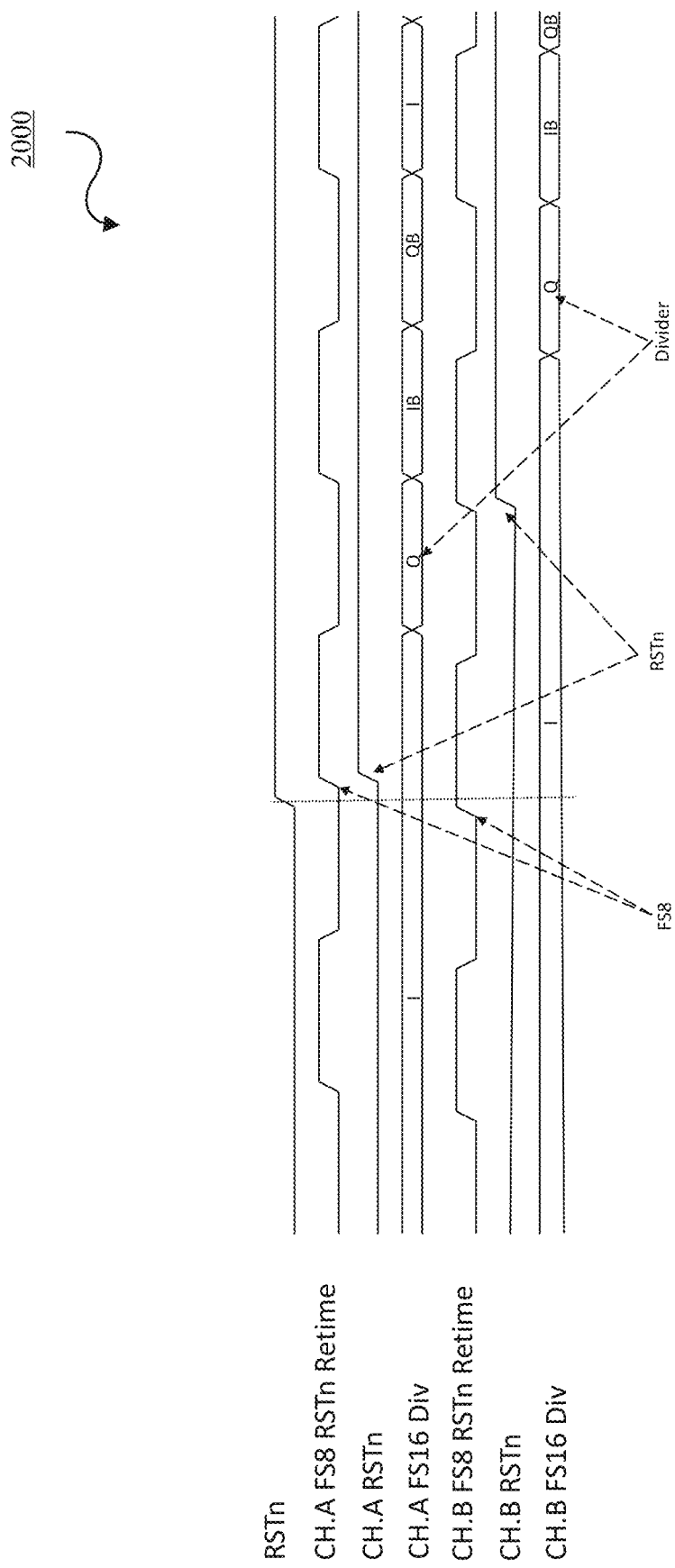
FIG. 2 is a diagram of poor reset pulse alignment in the high-speed multi-channel DAC of FIG. 1.

FIG. 2 is a diagram 2000 of poor reset pulse alignment in the high-speed multi-channel DAC 1000 of FIG. 1. As illustrated, the global reset (RSTn) is sent by a digital core or other interface. The RSTn arrives before a channel A reset retime clock (CH. A FS8 RSTn Retime) and the RSTn arrives after a channel B reset retime clock (CH. B FS8 RSTn Retime). This results in a large misalignment between a channel A reset retimed clock (CH. A FS8 RSTn retimed in FIG. 1 and CH. A RSTn in FIG. 2) and a channel B reset retimed clock (CH. B FS8 RSTn retimed in FIG. 1 and CH. B RSTn in FIG. 2). This large misalignment between the two channel leads to a large phase misalignment in the divider as shown by where the quadrature phases are for the CH. A FS16 Div clock and CH. B FS16 Div clock.

Described herein are circuits, devices, and methods to calibrate and align multiple high-speed clock domains. These clock domains can be located far apart on the same die or can be on different chips. The circuits have tolerances for clock path variation due to process, voltage, or local temperature shifts and can operate without the need for firmware integration.

The circuits described herein can use a timed reset pulse to align all of the dividers of all of the clock domains. To ensure that all of the clock domains are properly aligned, the launch point of the reset pulse must be retimed to match with a signal that is synchronous to the clocks that are being reset in each clock domain with a chosen alignment relative to this signal. The circuits described herein can determine this alignment by performing a series of trial resets and observing the timing margin on the received end. The timed reset pulse can be achieved by retiming the launch output of the reset pulse, checking the arrival of the reset pulse, and controlling the phase of the launched reset pulse with a monitor circuit to verify the validity of the received reset pulses. The circuit requires minimal silicon area and can be deactivated once no longer in use to save power.

In implementations, the circuits described herein can include a self-calibration circuit and method for high-speed circuit calibration and clock domain alignment. The self-calibration circuit and method can send the reset pulse with an initial value for the reset launch phase or reset time delay, record readback outputs from each clock domain, repeat sending and recording with different reset launch phases, select a reset launch phase setting where the readback outputs are at a same defined logic value, and record or store the reset launch phase setting for future start-up sequences. In the instance that multiple logic values are recorded, the self-calibration circuit and method can maximize the number of readback outputs received at the defined logic value for adjacent reset launch phase settings. The reset launch phase setting corresponding to the maximum number of readback outputs received at the defined logic value can be recorded or stored for future start-up sequences. In implementations, the self-calibration circuit and method can be implemented in firmware for automatic calibration. In implementations, the self-calibration circuit and method can be implemented as a finite state-machine in either a digital core or analog macro. The latter implementation requires no firmware changes are required as the self-calibration circuit is able to calibrate itself.

The circuits described herein allow for divider-based clock trees to be used, allowing for higher speed reference clocks. This can improve performance of the clock distribution. The circuits described herein use a reset clock tree with aligned launch and arrival timing. The launch timing is chosen to ensure that the received reset clock arrives at a time such that all clock domains are synchronized and have maximum margin with respect to process, voltage, and/or temperature variations. Once the correct launch phase is determined, power up can be done relatively quickly without the need for rotation of clock domains.

The circuits described herein do not require high-speed clocks to be distributed across the chip, which can save power. The circuitry can be powered off once start up is complete, minimizing the needed power. The circuitry is inexpensive in terms of the area required. Circuit calibration can be performed autonomously on startup, either with a firmware routine, or a custom designed built-in self-test circuit. This can simplify start-up, power-up sequencing, and can reduce the need for custom firmware. The circuitry allows for greater flexibility in the design of clock architectures, which can be chosen for other parameters rather than having clock alignment being a major consideration. For example, multiple parallel clock domains can be used. The circuits can save power over solutions (such as long distance clock routing). The circuits are applicable to systems with multiple clock domains that need synchronization.

Figure 3:
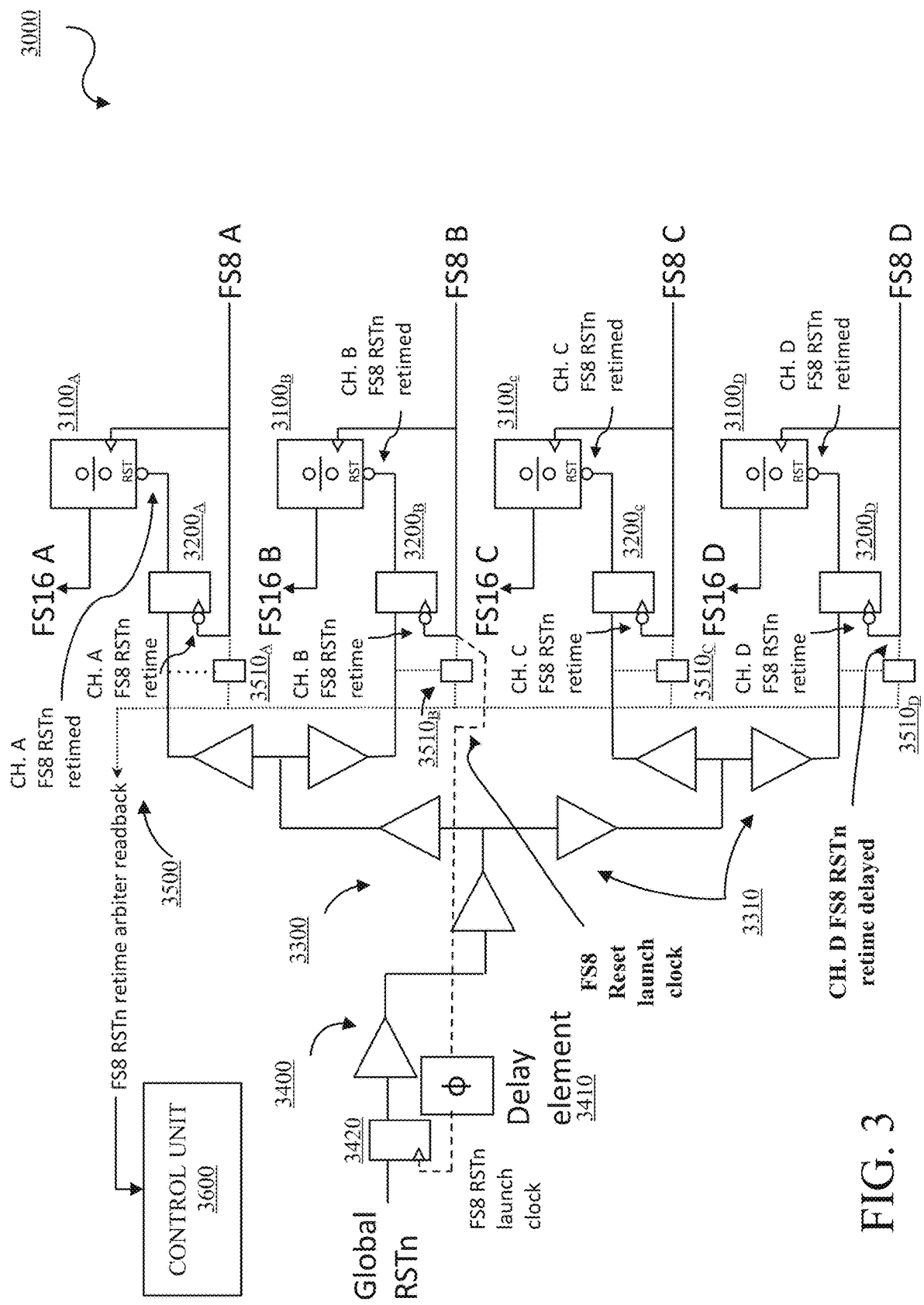
FIG. 3 is a block diagram of a high-speed multi-channel circuit which includes a reset launch circuit in accordance with embodiments of this disclosure.

FIG. 3 is a block diagram of a high-speed multi-channel circuit 3000 which includes a reset launch circuit in accordance with embodiments of this disclosure. In implementations, the high-speed multi-channel circuit 3000 can be a high-speed multi-channel DAC. The high-speed multi-channel circuit 3000 can include multiple channels, each channel representing a clock domain needing alignment with the other clock domains. The multiple channels can be on a same die or different dies. The high-speed multi-channel circuit 3000, can include, for example four channels A, B, C, and D.

Each channel can include a divider having a reset input connected to an output of a reset unit, namely, a divider 3100$_A$, a divider 3100$_B$, a divider 3100$_C$, and a divider 3100$_D$, and a reset unit 3200$_A$, a reset unit 3200$_B$, a reset unit 3200$_C$, and a reset unit 3200$_D$, respectively. The reset unit, for example, can be a D flip-flop. The clock input of each of the reset unit 3200$_A$, the reset unit 3200$_B$, the reset unit 3200$_C$, and the reset unit 3200$_D$ is connected to a FS8 RSTn retime clock, namely, a CH. A FS8 RSTn retime clock, a CH. B FS8 RSTn retime clock, a CH. C FS8 RSTn retime clock, and a CH. D FS8 RSTn retime clock. As before, the notation of "n" is to signify an inverted polarity. A "reset" signal is active high, i.e., resets the circuit when the signal is high, whereas a "resetn" (or "resetb") signal is active low, i.e., resets the circuit when the signal is low. The description and claims described herein are applicable to implementations using either logic state. As is understood, the respective FS8 clocks and FS8 RSTn retime clocks are from respective FS8 clock busses, where the FS8 clocks and the FS8 RSTn retime clocks have different phases or temporally delayed with respect to each other.

Each of the divider 3100$_A$, divider 3100$_B$, divider 3100$_C$, and divider 3100$_D$ has a clock input connected to a FS8 clock, namely, a FS8 A clock, a FS8 B clock, a FS8 C clock, and a FS8 D clock. Each of the divider 3100$_A$, divider 3100$_B$, divider 3100$_C$, and divider 3100$_D$ can output a FS16 clock, namely, a FS16 A clock, a FS16 B clock, a FS16 C clock, and a FS16 D clock, from the FS8 A clock, FS8 B clock, FS8 C clock, and FS8 D clock. The FS8 and FS16 clocks are illustrative of a first frequency and a second frequency related by a division factor. The divider can be a divide by N divider.

A global reset pulse (Global RSTn) is launched to an input of each of the reset unit $3200_A$, the reset unit $3200_B$, the reset unit $3200_C$, and the reset unit $3200_D$ via a reset clock tree 3300 and a reset launch circuit 3400. The reset clock tree 3300 can include delay units 3310 which are configured to match a main clock tree (not shown for convenience).

The reset launch circuit 3400 can include a variable delay circuit 3410 connected to a clock input of a reset launch unit 3420. The reset launch unit 3420 can be, for example, a D flip-flop. The global reset pulse is connected to an input of the reset launch unit 3420. The output of the reset launch unit 3420 is connected to the reset clock tree 3300 and to each of the reset unit $3200_A$, the reset unit $3200_B$, the reset unit $3200_C$, and the reset unit $3200_D$. The variable delay circuit 3410 can be, for example, a buffer, a delay, a multiplexer, or a phase shifter.

The high-speed multi-channel circuit 3000 can include a self-calibration unit 3500. The self-calibration unit 3500 can include an arbiter, namely, arbiter $3510_A$, arbiter $3510_B$, arbiter $3510_C$, and arbiter $3510_D$, each of which is connected to a FS8 RSTn retime delayed clock, namely, a CH. A FS8 RSTn retime delayed clock, a CH. B FS8 RSTn retime delayed clock, a CH. C FS8 RSTn retime delayed clock, and a CH. D FS8 RSTn retime delayed clock (only the CH. D FS8 RSTn retime delayed clock is shown for convenience), respectively, and the Global RSTn. The arbiters output a logic high or low depending on a timing difference. The output of each of the arbiter $3510_A$, the arbiter $3510_B$, the arbiter $3510_C$, and the arbiter $3510_D$ can be connected to a digital core, controller, and/or interface (collectively "control unit") 3600, which can make a decision based on the collective outputs as described herein and set an appropriate delay in the variable delay circuit 3410.

Operationally, once a delay is determined as described herein, the clock generation circuit 3100 can send the Global RSTn pulse to each of the dividers so that each divider starts in the same state, at a logic low state or a logic high state, and at the same or nearly same time, resulting in channel or clock domain alignment. Noting that the divider is driven by the FS8 clock, the Global RSTn pulse can arrive after the FS8 clock arrives at the divider or before the FS8 clock arrives at the divider. Alignment is enabled by ensuring that the Global RSTn pulse arrives at each divider when the divider is not changing. That is, Global RSTn pulse arrivals are timed not to arrive during input clock transitions at the divider.

To give the optimal timing margin for the FS8 RSTn retime clock, the Global RSTn pulse is launched to optimize the timing margin at the arrival of the Global RSTn pulse at each channel with respect to the FS8 RSTn retime clock. Since the delay path from the global launch point to the receive point at each channel is unknown (as the delay path is highly dependent on transistor and process corners), the optimal launch timing must be determined experimentally.

Operationally, when in a test mode, the self-calibration unit 3500 can be powered on and activated. The self-calibration unit 3500 in cooperation with the reset launch circuit 3400 can use a FS8 reset launch clock from one of the channels (shown as coming from channel C) as an input to the variable delay circuit 3410. The FS8 reset launch clock is a different phase/temporally delayed clock with respect to the FS8 RSTn retime clock and can be used to synchronize or make coherent the Global RSTn pulse with the FS8 RSTn retime clock. The FS8 reset launch clock can be used to maintain consistency as to when the Global RSTn is launched since the timing of Global RSTn relative to the FS8 clocks cannot otherwise be controlled or determined.

The variable delay circuit 3410 can apply defined delays, as set by the control unit 3600, to the FS8 reset launch clock to generate respective FS8 RSTn launch clocks. As described herein, a delay is set and selected which maintains a maximum timing margin between a received Global RSTn pulse at each channel and the respective FS8 RSTn retime clock. That is, the variable delay circuit 3410 can set the launch position or time of the Global RSTn pulse using the FS8 reset launch clock. The FS8 RSTn launch clocks are input clocks to the reset launch unit 3420, which can align the Global RSTn pulse with the FS8 RSTn retime clock.

The arbiters in each channel can determine the arrival time of the Global RSTn pulse relative to the FS8 RSTn retime clock in each channel to determine if it arrives in a safe timing region as further described herein below. The safe timing region (based on the described logic state implementation which uses RSTn for active low) is a region where the launching of the Global RSTn pulse is close to the falling edge of the FS8 RSTn retime clock for one or more channels. The arbiters can send readback signals to the control unit 3600. As described herein, the control unit 3600 can select and set a delay if the readback signals are all of the same logic state. The Global RSTn pulse is now in synchronization or in the same clock domain as the local clock of each channel (the FS8 RSTn retime clock). The selected delay, as described herein, enables the Global RSTn pulse to arrive at each divider at the correct time. The selected delay can be saved in firmware for future start-ups. The self-calibration unit 3500 can be powered off and deactivated after setting of the delay.

Figure 4:
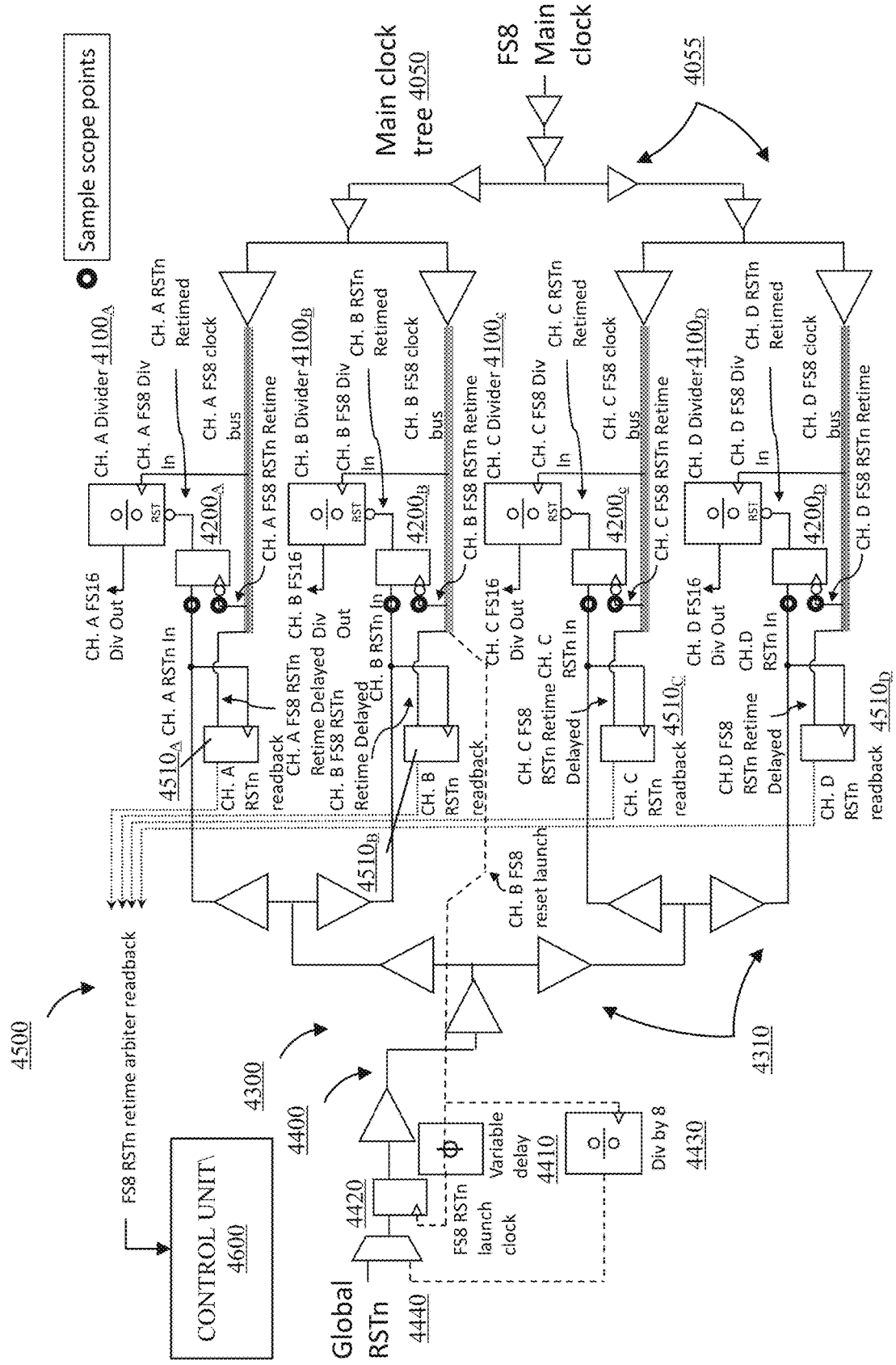
FIG. 4 is a block diagram of a high-speed multi-channel circuit which includes a reset launch circuit in accordance with embodiments of this disclosure.

FIG. 4 is a block diagram of a high-speed multi-channel circuit 4000 which includes a reset launch circuit in accordance with embodiments of this disclosure. In implementations, the high-speed multi-channel circuit 4000 can be a high-speed multi-channel DAC. The high-speed multi-channel circuit 4000 can include multiple channels, each channel representing a clock domain needing alignment with the other clock domains. The multiple channels can be on a same die or different dies. The high-speed multi-channel circuit 4000, can include, for example four channels A, B, C, and D. A main clock tree 4050 distributes a FS8 main clock over channel specific FS8 clock busses, namely, a CH. A FS8 clock bus, a CH. B FS8 clock bus, a CH. C FS8 clock bus, and a CH. D FS8 clock bus. The main clock tree 4050 can include delay units 4055.

Each channel can include a divider having a reset input connected to an output of a reset unit for each channel, namely, a divider $4100_A$, a divider $4100_B$, a divider $4100_C$, and a divider $4100_D$, and a reset unit $4200_A$, a reset unit $4200_B$, a reset unit $4200_C$, and a reset unit $4200_D$, respectively. The reset unit, for example, can be a D flip-flop. The clock input of each of the reset unit $4200_A$, the reset unit $4200_B$, the reset unit $4200_C$, and the reset unit $4200_D$ is connected to a FS8 RSTn retime clock, namely, a CH. A FS8 RSTn retime clock, a CH. B FS8 RSTn retime clock, a CH. C FS8 RSTn retime clock, and a CH. D FS8 RSTn retime clock. As before, the notation of "n" is to signify an inverted polarity. A "reset" signal is active high, i.e., resets the circuit when the signal is high, whereas a "resetn" (or "resetb") signal is active low, i.e., resets the circuit when the signal is low. The description and claims described herein are applicable to implementations using either logic state. As is understood, the respective FS8 clocks, FS8 RSTn retime clocks, and other noted FS8 clocks are from respective FS8 clock busses, where the respective FS8 clocks, FS8 RSTn retime clocks, and other noted FS8 clocks have different phases or are temporally delayed with respect to each other.

Each of the divider 4100$_A$, divider 4100$_B$, divider 4100$_C$, and divider 4100$_D$ has a clock input connected to a FS8 clock, namely, a CH. A FS8 Div In clock, a CH. B FS8 Div In clock, a CH. C FS8 Div In clock, and a CH. D FS8 Div In clock. Each of the divider 4100$_A$, divider 4100$_B$, divider 4100$_C$, and divider 4100$_D$ can output a FS16 clock, namely, a CH. A FS16 Div Out clock, a CH. B FS16 Div Out clock, a CH. C FS16 Div Out clock, and CH. D FS16 Div Out clock, from the CH. A FS8 Div In clock, the CH. B FS8 Div In clock, the CH. C FS8 Div In clock, and the CH. D FS8 Div In clock. The FS8 and FS16 clocks are illustrative of a first frequency and a second frequency related by a division factor. The divider can be a divide by N divider.

A global reset pulse (Global RSTn) is launched to an input of each of the reset unit 4200$_A$, the reset unit 4200$_B$, the reset unit 4200$_C$, and the reset unit 4200$_D$ via a reset clock tree 4300 and a reset launch circuit 4400. The reset clock tree 4300 can include delay units 4310 which are configured to match the delay units 4055 in the main clock tree 4050.

The reset launch circuit 4400 can include a variable delay circuit 4410, a reset launch unit 4420, a reference clock generator unit 4430, and a multiplexor 4440. The reset launch unit 3420 can be, for example, a D flip-flop. The reference clock generator unit 4430 can be, for example, a divider, a delay element, or a phase shifter. The variable delay circuit 4410 can be connected to a clock input of the reset launch unit 4420. One input of the multiplexor 4440 is connected to the reference clock generator unit 4430 and another input can be connected to the Global RSTn. The output of the multiplexor 4440 can be connected to the reset launch unit 4420. The multiplexor 4440 can enable switching operation of the high-speed multi-channel circuit 4000 between a normal operating mode and a delay setting or test mode.

The high-speed multi-channel circuit 4000 can include a self-calibration unit 4500. The self-calibration unit 4500 can include an arbiter, namely, arbiter 4510$_A$, arbiter 4510$_B$, arbiter 4510$_C$, and arbiter 4510$_D$, each of which is connected to a FS8 RSTn retime delayed clock, namely, a CH. A FS8 RSTn retime delayed clock, a CH. B FS8 RSTn retime delayed clock, a CH. C FS8 RSTn retime delayed clock, and a CH. D FS8 RSTn retime delayed clock, respectively, and the Global RSTn pulse, namely, a CH. A RSTn In, a CH. B RSTn In, a CH. C RSTn In, and a CH. D RSTn In. The arbiters can be, for example, D flip-flops. The arbiters output a logic high or low depending on a timing difference. The output of each of the arbiter 4510$_A$, the arbiter 4510$_B$, the arbiter 4510$_C$, and the arbiter 4510$_D$, namely, a CH. A RSTn readback signal, a CH. B RSTn readback signal, a CH. C RSTn readback signal, and a CH. D RSTn readback signal, can be connected to a digital core, controller, and/or interface (collectively "control unit") 4600, which can make a decision based on the collective outputs as described herein and set an appropriate delay in the variable delay circuit 4410.

Operationally, once a delay is determined as described herein, the clock generation circuit 4100 can send the Global RSTn pulse to each of the dividers so that each divider starts in the same state, at a logic low state or a logic high state, and at the same or nearly same time, resulting in channel or clock domain alignment. Noting that the divider is driven by the FS8 clock, the Global RSTn pulse can arrive after the FS8 clock arrives at the divider or before the FS8 clock arrives at the divider. Alignment is enabled by ensuring that the Global RSTn pulse arrives at each divider when the divider is not changing. That is, Global RSTn pulse arrivals are timed not to arrive during input clock transitions at the divider.

To give the optimal timing margin for the FS8 RSTn retime clock, the Global RSTn pulse is launched to optimize the timing margin at the arrival of the Global RSTn pulse at each channel with respect to the FS8 RSTn retime clock. Since the delay path from the global launch point to the receive point at each channel is unknown (as the delay path is highly dependent on transistor and process corners), the optimal launch timing must be determined experimentally.

In implementations, verification of whether the delay is correct can be done using data path DAC sample scope points, using a sample scope as described herein, using the self-calibration unit 3500 as described herein, or combinations thereof (collectively verification methods or circuits). In implementations, the setting of the delay can be done using the sample scope as described herein, the self-calibration unit 3500 as described herein, or combinations thereof (collectively setting methods or circuits).

Operationally, a sample scope enable signal can be provided to the multiplexor 4440, which in turn places the high-speed multi-channel circuit 4000 in a test mode. The sample scope is a built-in oscilloscope-type circuit which can be used to obtain signal behavior at designated sample scope points 4700. The sample scope uses a periodic or repetitive signal to send the Global RSTn pulse. The reference clock generator unit 4430 can use a FS8 reset launch clock from one of the channel FS8 clock busses (shown as coming from channel C) to output a reference clock which enables sending of the Global RSTn at a fixed rate coherently with a system clock (e.g., the base clock for the FS8 main clock). The FS8 reset launch clock is a different phase/temporally delayed clock with respect to the FS8 RSTn retime clock and can be used to synchronize or make coherent the Global RSTn pulse with the FS8 RSTn retime clock.

The variable delay circuit 4410 can apply defined delays, as set by the control unit 4600, to the FS8 reset launch clock to generate respective FS8 RSTn launch clocks. As described herein, a delay is set and selected which maintains a maximum timing margin between a received Global RSTn pulse at each channel and the respective FS8 RSTn retime clock. The variable delay circuit 4410 can set the launch position or time of the Global RSTn pulse using the FS8 reset launch clock. That is, the Global RSTn pulse is retimed by the FS8 reset launch clock.

The output of the sample scope can be sent to, for example, the control unit 4600, which in turn can be used to observe the signal behavior by an external user. The arrival of the Global RSTn pulse and the FS8 RSTn retime clock can be observed at each channel. The rising edge of the incoming Global RSTn pulse (before retiming) should line up as close as possible to the falling edge of the FS8 RSTn retime clock in all 4 channels to give the best timing margin. As noted herein, the "edge" being used is dependent on the logic implementation. Therefore, the falling edge or the rising edge can be appropriate dependent on the logic implementation. The term sensitive edge can be used to refer to either the falling edge or the rising edge dependent on the logic implementation. The control unit 4600 can then be used to set the delay which provides the optimal timing margin as described herein. The sample scope enable can be disabled once the delay is set.

Operationally, when in a test mode, the self-calibration unit 4500 can be powered on and activated. The self-calibration unit 4500 in cooperation with the reset launch circuit 4400 can use the FS8 reset launch clock as an input to the variable delay circuit 4410. The FS8 reset launch clock is a different phase/temporally delayed clock with respect to the FS8 RSTn retime clock and can be used to synchronize or make coherent the Global RSTn pulse with the FS8 RSTn retime clock. The FS8 reset launch clock can be used to maintain consistency as to when the Global RSTn is launched since the timing of Global RSTn relative to the FS8 clocks cannot otherwise be controlled or determined.

The variable delay circuit 4410 can apply defined delays, as set by the control unit 4600, to the FS8 reset launch clock to generate respective FS8 RSTn launch clocks. As described herein, a delay is set and selected which maintains a maximum timing margin between a received Global RSTn pulse at each channel and the respective FS8 RSTn retime clock. That is, the variable delay circuit 4410 can set the launch position or time of the Global RSTn pulse using the FS8 reset launch clock. The FS8 RSTn launch clocks are input clocks to the reset launch unit 4420, which can align the Global RSTn pulse with the FS8 RSTn retime clock.

Figure 5:
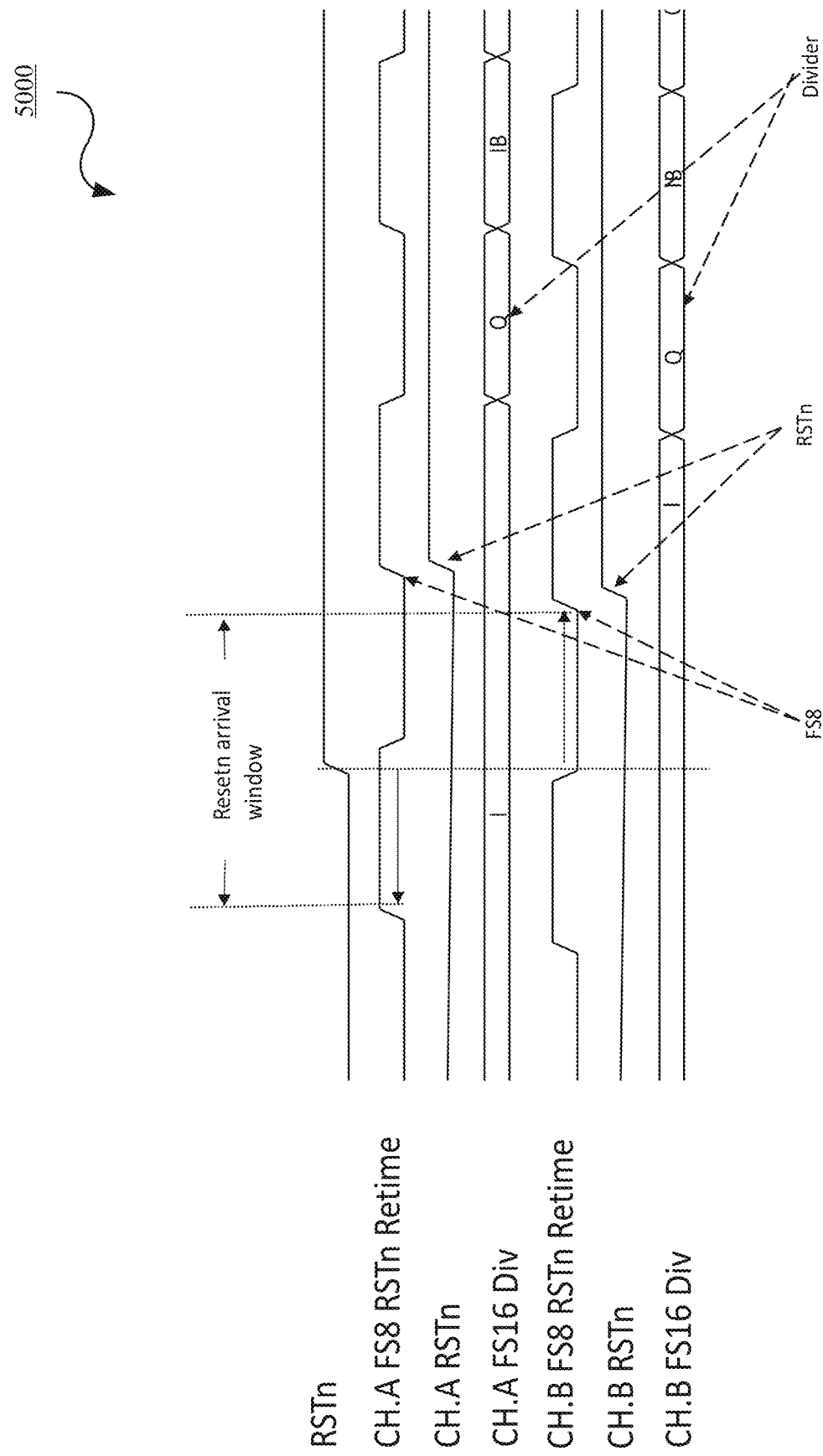
FIG. 5 is a diagram of correct reset pulse alignment in accordance with embodiments of this disclosure.

The arbiters in each channel can determine the arrival time of the Global RSTn pulse relative to the FS8 RSTn retime clock in each channel to determine if it arrives in a safe timing region as further described herein below. The safe timing region (based on the described logic state implementation which uses RSTn for active low) is a region where the launching of the Global RSTn pulse is close to the falling edge of the FS8 RSTn retime clock for one or more channels. The arbiters can use the incoming Global RSTn pulse to sample a FS8 RSTn Retime Delayed clock (coming from the appropriate FS8 clock bus), namely, a CH. A FS8 RSTn Retime Delayed clock, a CH. B FS8 RSTn Retime Delayed clock, a CH. C FS8 RSTn Retime Delayed clock, and a CH. D FS8 RSTn Retime Delayed clock. If the Global RSTn pulse arrives near the falling edge of the FS8 RSTn retime clock, the readback resampling will return a constant '1'. The arbiters can send readback signals to the control unit 4600. If the readback sampling is 1 on all 4 channels after the Global RSTn is sent, the Global RSTn should have been received with good timing margin for all channels. This can be seen, for example, in FIG. 5, which is a diagram 5000 of correct reset pulse alignment in accordance with embodiments of this disclosure. As shown, the rising edge of Global RSTn pulse (RSTn pulse) is near a falling edge of the CH. A FS8 RSTn retime clock and the CH. B FS8 RSTn retime clock to maximize timing margin. In contrast to FIG. 2, the quadrature phases are for the CH. A FS16 Div clock and CH. B FS16 Div clock are in near alignment.

The control unit 4600 can select and set the delay if the readback signals are all of the same logic state. The Global RSTn pulse is now in synchronization or in the same clock domain as the local clock of each channel (the FS8 RSTn retime clock). The selected delay, as described herein, enables the Global RSTn pulse to arrive at each divider at the correct time. The selected delay can be saved in firmware for future start-ups. The self-calibration unit 4500 can be powered off and deactivated after setting of the delay.

Figure 6:
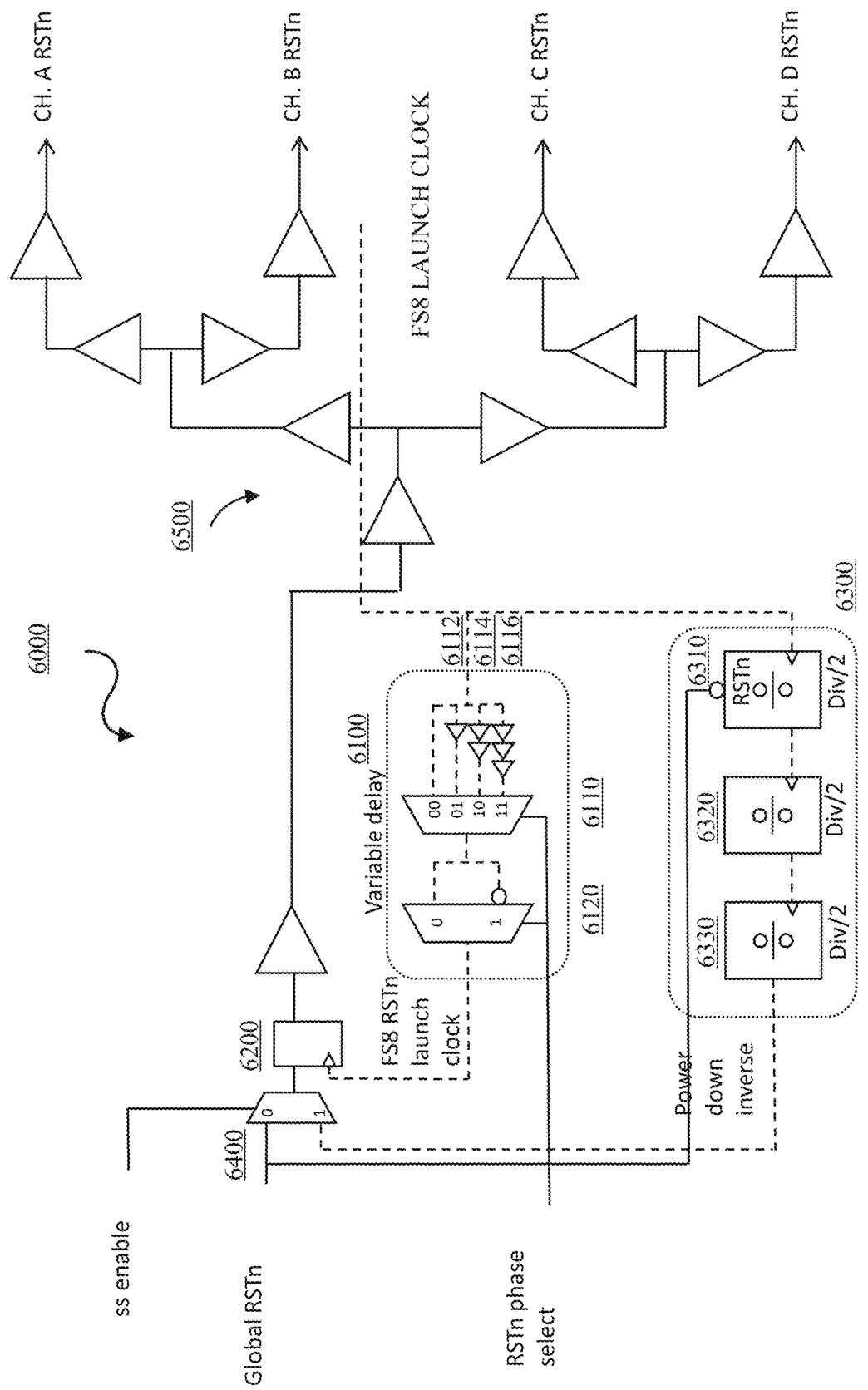
FIG. 6 is a block diagram of a reset launch circuit in accordance with embodiments of this disclosure.

FIG. 6 is a block diagram of a reset launch circuit 6000 in accordance with embodiments of this disclosure. In implementations, the reset launch circuit 6000 can be used in the high-speed multi-channel circuit 3000 and the high-speed multi-channel circuit 4000. The reset launch circuit 6000 can include a variable delay circuit 6100, a reset launch unit 6200, a reference clock generator unit 6300, and a multiplexor 6400. The reset launch unit 6200 can be, for example, a D flip-flop. The variable delay circuit 6100 can be connected to a clock input of the reset launch unit 6200. One input of the multiplexor 6400 can be connected to the reference clock generator unit 6300 and another input can be connected to the Global RSTn. The output of the multiplexor 6400 can be connected to the reset launch unit 6200. The multiplexor 6400 can enable switching operation of a high-speed multi-channel circuit between a normal operating mode and a delay setting or test mode. The output of the reset launch unit 6200 can be connected to a reset clock tree 6500 for distribution of the Global RSTn to each of the respective channels.

The reference clock generator unit 6300 can include a first divider 6310, a second divider 6320, and a third divider 6330 connected in serial, which can be rest via the Global RSTn. The clock input of the first divider 6310 is connected to a FS8 launch clock as described herein. The output of the third divider 6330 can be connected to the multiplexor 6400.

The variable delay circuit 6100 can include a first multiplexor 6110 connected to a second multiplexor 6120, which in turn can be connected to the reset launch unit 6200. The first multiplexor 6110 can include four inputs, 00, 01, 10, and 11, where a 01 input has one delay 6112 connected to the input, a 10 input has two delays 6114 connected to the input, and a 11 input has three delays 6116 connected to the input. The second multiplexor 6120 can include 2 inputs. The inputs of the first multiplexor 6110 and the second multiplexor 6120 can be selected based on a delay selection (RSTn phase select) signal from a control unit (not shown). The combination of the first multiplexor 6110 and the second multiplexor 6120 can provide 8 possible launch phase settings that span, for example, a 100 ps interval. During testing, each launch phase setting is selected and observations or readings are made to determine the appropriate launch phase setting.

Figure 7:
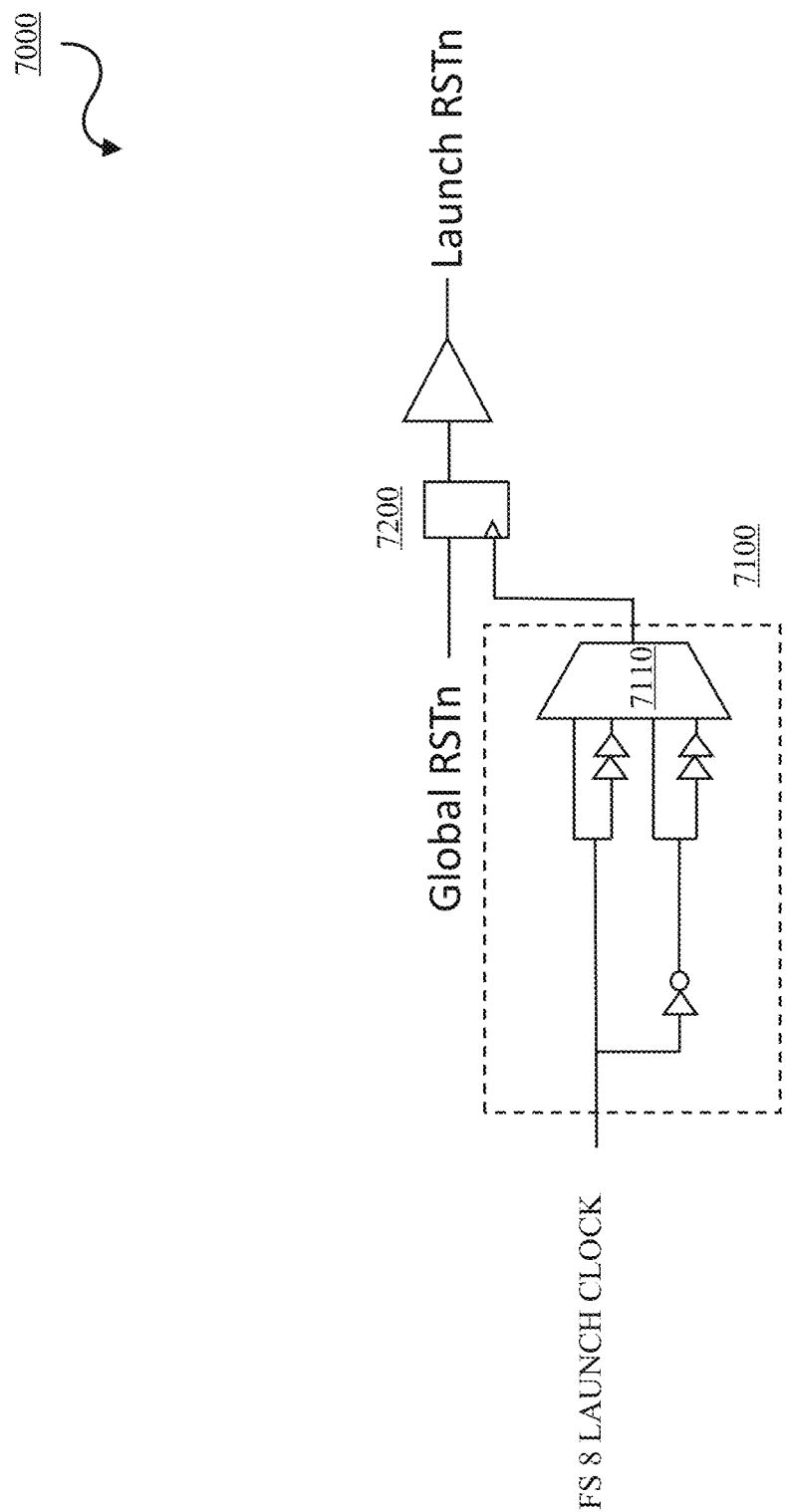
FIG. 7 is a block diagram of a reset launch circuit in accordance with embodiments of this disclosure.

FIG. 7 is a block diagram of a reset launch circuit 7000 in accordance with embodiments of this disclosure. In implementations, the reset launch circuit 7000 can be used in the high-speed multi-channel circuit 3000 and the high-speed multi-channel circuit 4000. The reset launch circuit 7000 can include a variable delay circuit 7100 connected to a clock input of a reset launch unit 7200. The reset launch unit 7200 can be a D flip-flop. A Global RSTn is connected to an input of the reset launch unit 7200. A FS8 launch clock is connected to an input of the variable delay circuit 7100.

The variable delay circuit 7100 can include a multiplexor 7110 with four inputs, one for the FS8 launch clock, one for a delayed FS8 launch clock, one for an inverted FS8 launch clock, and one for a delayed inverted FS8 launch clock. The variable delay circuit 7100 can use other logic circuits including, for example, consecutive multiplexors, exclusive OR circuits, phase rotators, and combinations thereof. Digital delay elements can be used to implement the variable delay circuit 7100.

The multiplexor 7110 can provide multiple launch phase settings which can be selected by a control unit. During testing, each launch phase setting is selected and observations or readings are made to determine the appropriate launch phase setting.

Figure 8:
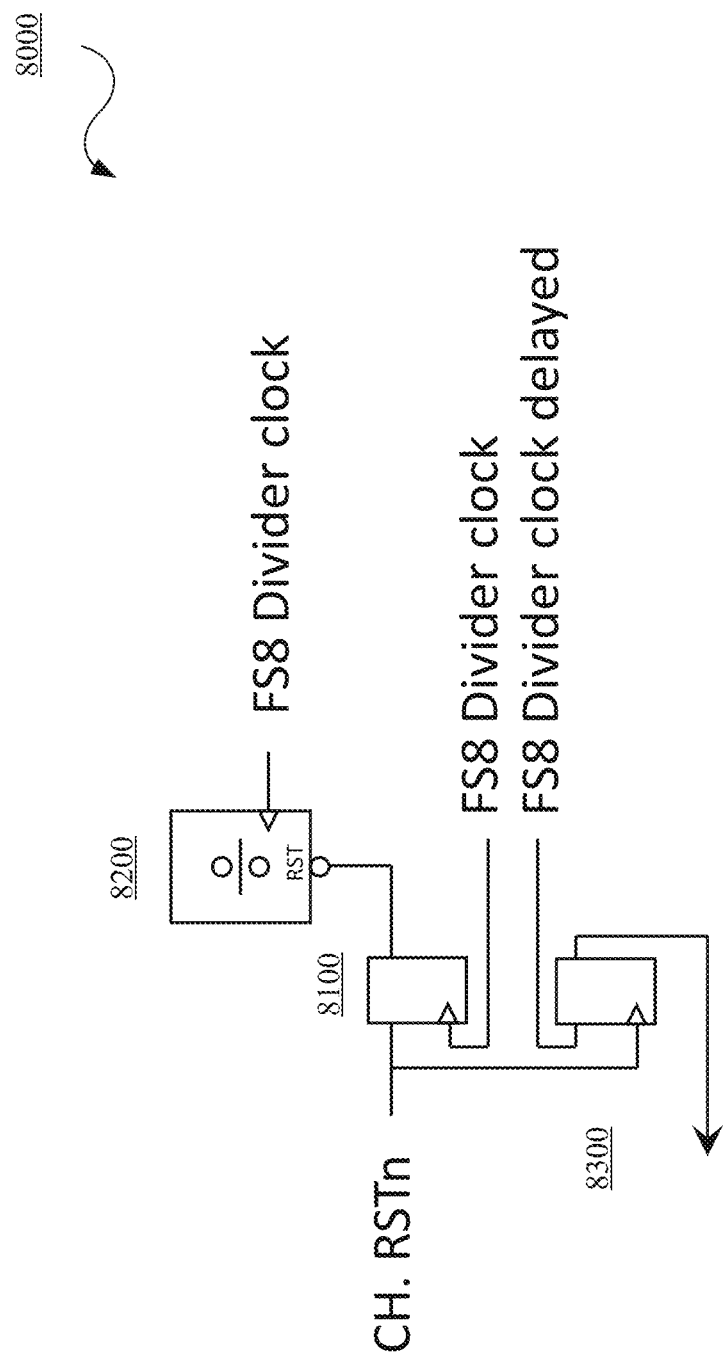
FIG. 8 is a block diagram of a receive retiming circuit in accordance with embodiments of this disclosure.

FIG. 8 is a block diagram of a receive retiming circuit 8000 in accordance with embodiments of this disclosure. The receive retiming circuit 8000 can be implemented in each channel in, for example, the high-speed multi-channel circuit 3000 and the high-speed multi-channel circuit 4000.

Figure 9:
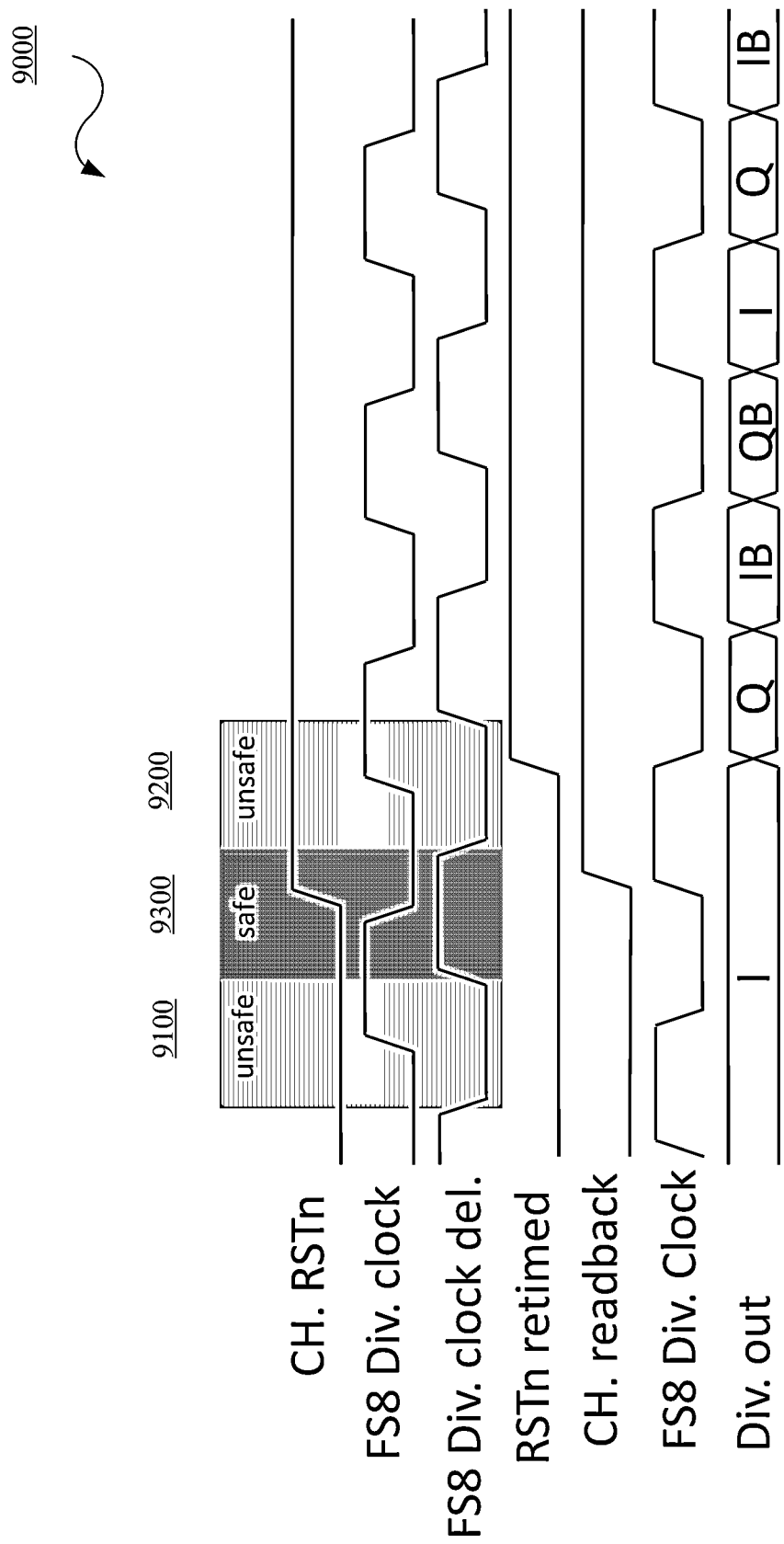
FIG. 9 is a diagram of a safe arrival window in accordance with embodiments of this disclosure.

The receive retiming circuit 8000 can include a reset retime unit 8100 configured to receive a Global RSTn pulse and a FS8 divider clock at a clock input. The output of the reset retime unit 8100 can be connected to a divider 8200 to reset a state of the divider 8200. An arbiter 8300 is configured to output a channel readback by sampling a FS8 divider clock delayed using the Global RSTn pulse. The arbiter 8300 can determine if the Global RSTn pulse was launched in a safe region as shown in FIG. 9, which is a diagram 9000 of unsafe arrival windows 9100 and 9200 and a safe arrival window 9300 in accordance with embodiments of this disclosure. After the Global RSTn pulse is sent, the readback from all arbiters can be analyzed by a control unit (not shown) as described herein. If all the readbacks are at a same logic level, for example, a logic one in this example, the Global RSTn pulse was received in the safe arrival window 9300 for all channels, indicating that the dividers were aligned correctly.

Figure 10:
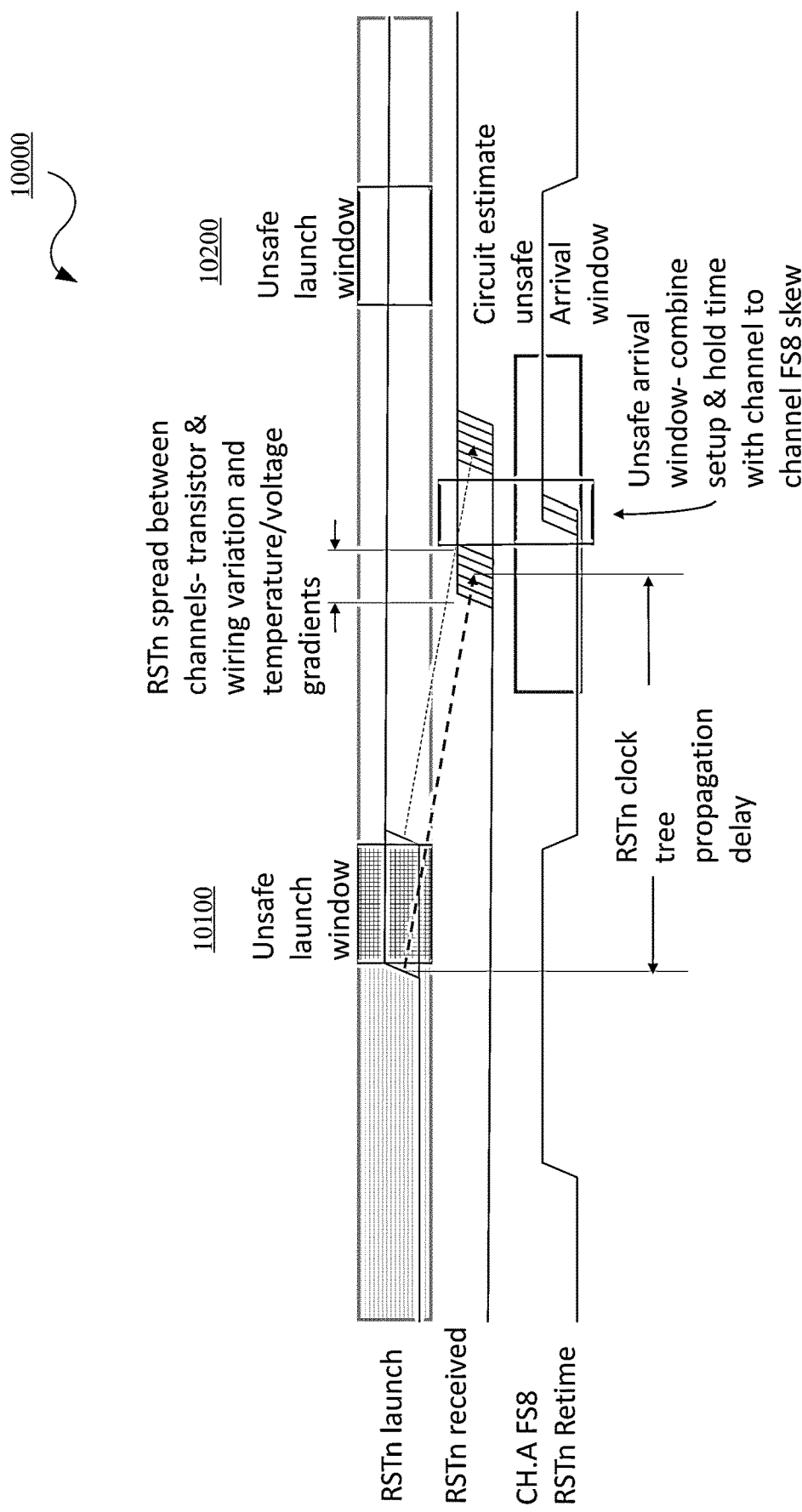
FIG. 10 is a diagram of unsafe arrival windows in accordance with embodiments of this disclosure.

FIG. 10 is a diagram 10000 of unsafe arrival windows in accordance with embodiments of this disclosure. As described herein, dividers can operate in two states and a reset pulse (RSTn) can be used to align all dividers in a same state. However, the reset pulse is an asynchronous signal which is not in a same clock domain as the frequency clocks used with the dividers. The reset pulse for each channel can undergo different propagation delay, different propagation delay spread, channel to channel frequency clock skew, setup and hold time. The reset pulse can arrive after or before a reset retime signal or when the divider is transitioning.

For a logic implementation of low active, RSTn unsafe launch windows, such as 10100 and 10200 equate to launching the RSTn far from the falling edges of a reset retime clock (CH. A FS8 RSTn Retime in FIG. 10). By accounting for the RSTn clock tree propagation delay, placement of an unsafe arrival 10300 can be determined. The width of the unsafe arrival window 10300 can be determine based on channel to channel frequency clock skew and setup and hold time. This can be referred to as a true unsafe arrival window. For example, an expected variability on RSTn clock tree due to temperature and process can be less than 4 ps, the setup and hold time can be approximately 8 ps, and the channel to channel FS8 skew can be less than 1 ps. Additional factors, such as wiring variations and channel-channel voltage and/or temperature variations can affect the width of the unsafe arrival window 10300. Timing margin optimization can be achieved by setting the unsafe arrival window 10300 to +/−25 ps, for example. That is, a reset retime or reset launch circuit can use a factor of two of the true unsafe arrival window to provide correct alignment of RSTn pulses.

Figure 11:
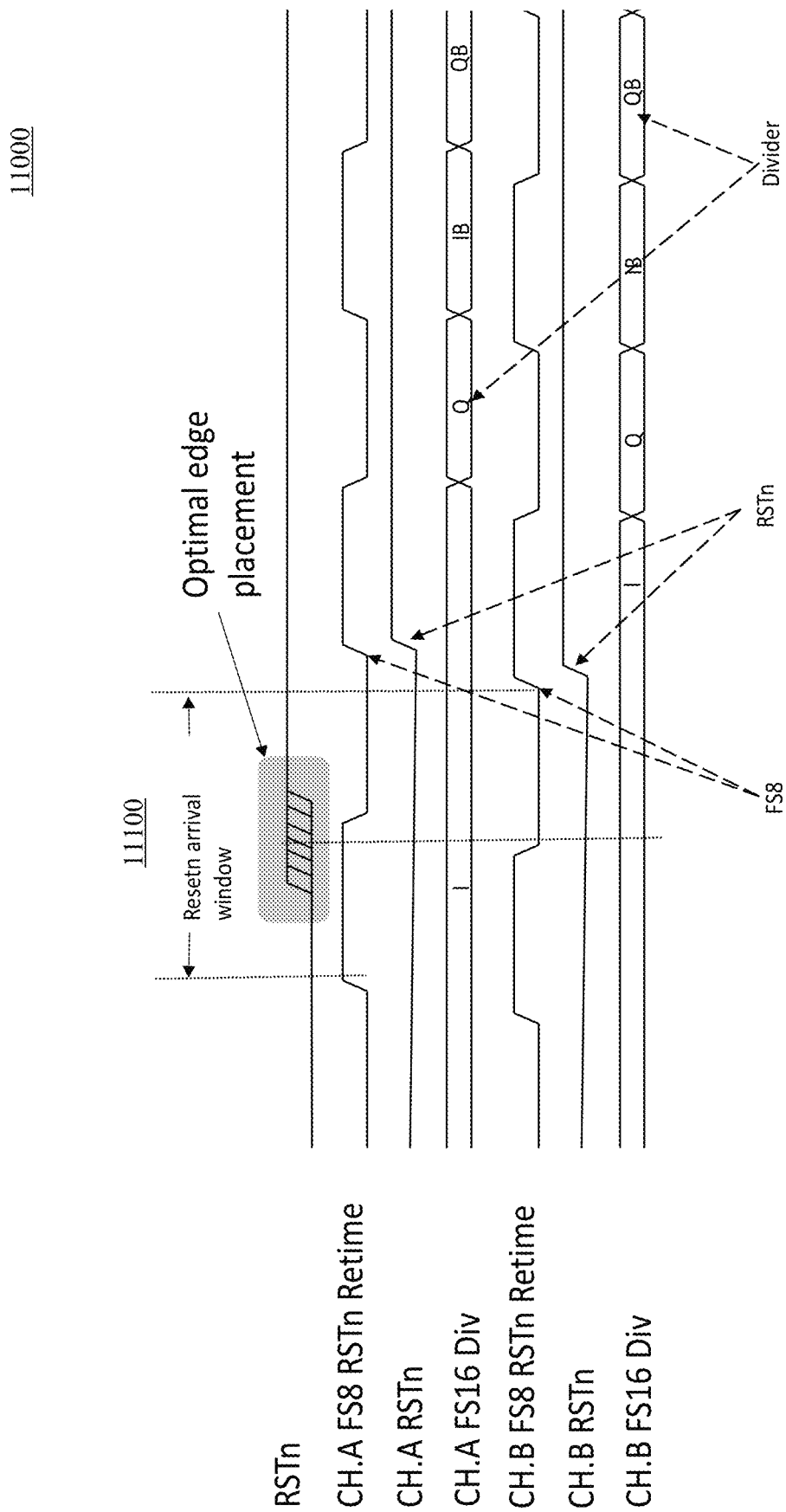
FIG. 11 is a diagram of a reset arrival window in accordance with embodiments of this disclosure.

FIG. 11 is a diagram 11000 of a resetn arrival window 11100 in accordance with embodiments of this disclosure. Building on the analysis described in the FIG. 10, the resetn arrival window 11100 should be near or centered around a falling edge of the reset retime clock (CH. A. FS8 RSTn Retime). That is, rising edges of the RSTn pulse should come near the falling edge of the CH. A. FS8 RSTn Retime to maximize the timing margin.

Figure 12:
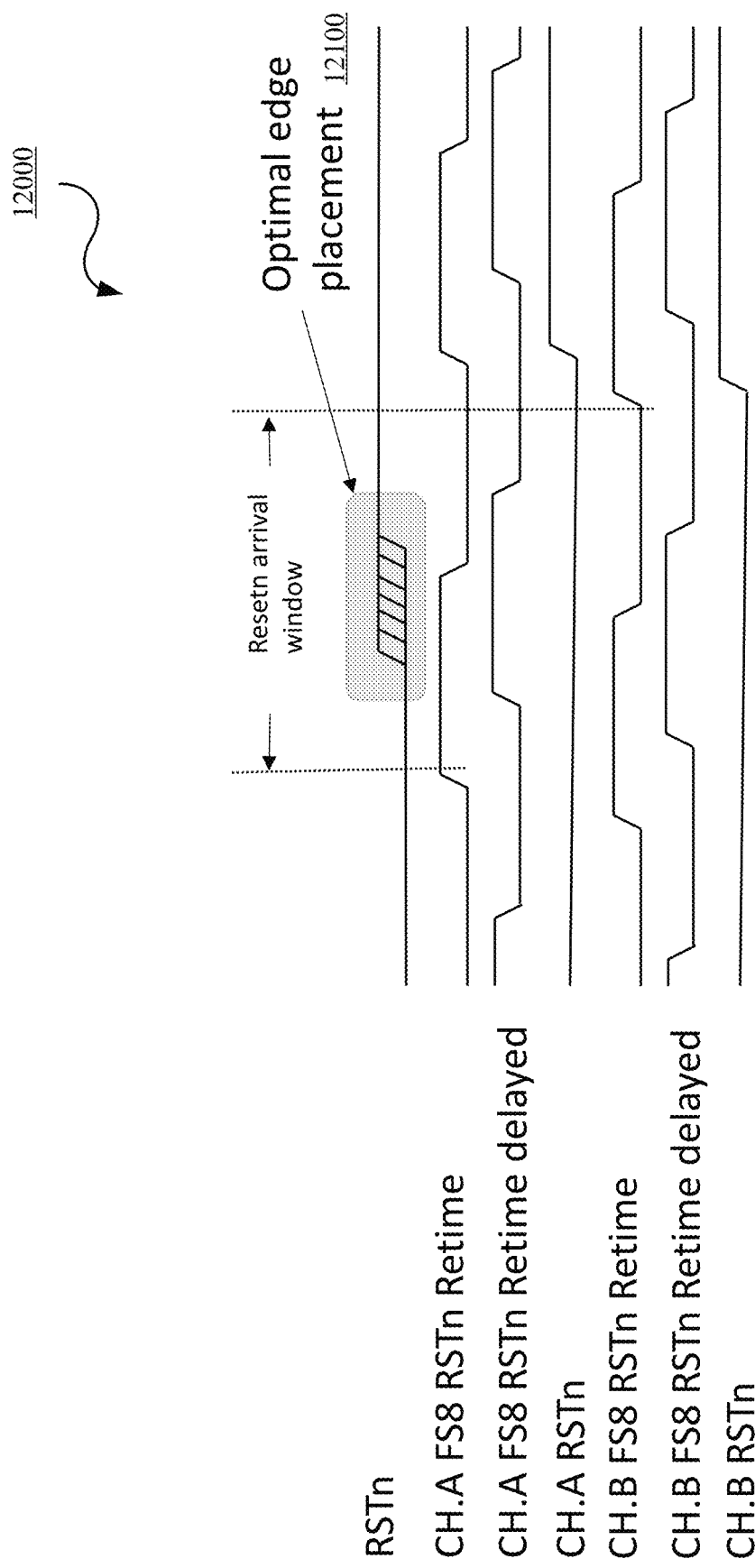
FIG. 12 is a diagram of reset feedback functionality in accordance with embodiments of this disclosure.

FIG. 12 is a diagram 12000 of a reset feedback functionality in accordance with embodiments of this disclosure. As described herein, self-calibrating circuits can determine if a delay or phase setting provides divider alignment for all channels in a multi-channel device. The self-calibrating circuits, notably the arbiter, can determine if a resetn pulse arrives in an optimal arrival window 12000 by sampling the FS8 RSTn Retime delayed clock using the resetn pulse. A readback value of 1 can be sent to a control unit if the rising edge of the resetn pulse is in the optimal arrival window 12100. If a 1 is returned for all channels, the resetn pulse lines up closely with the falling edge of the FS8 retime clock. This can provide a good timing margin for the phase setting used. A "0" on one channel does not necessarily indicate a problem as the optimal arrival window 12100 is conservative as described herein.

Figure 13:
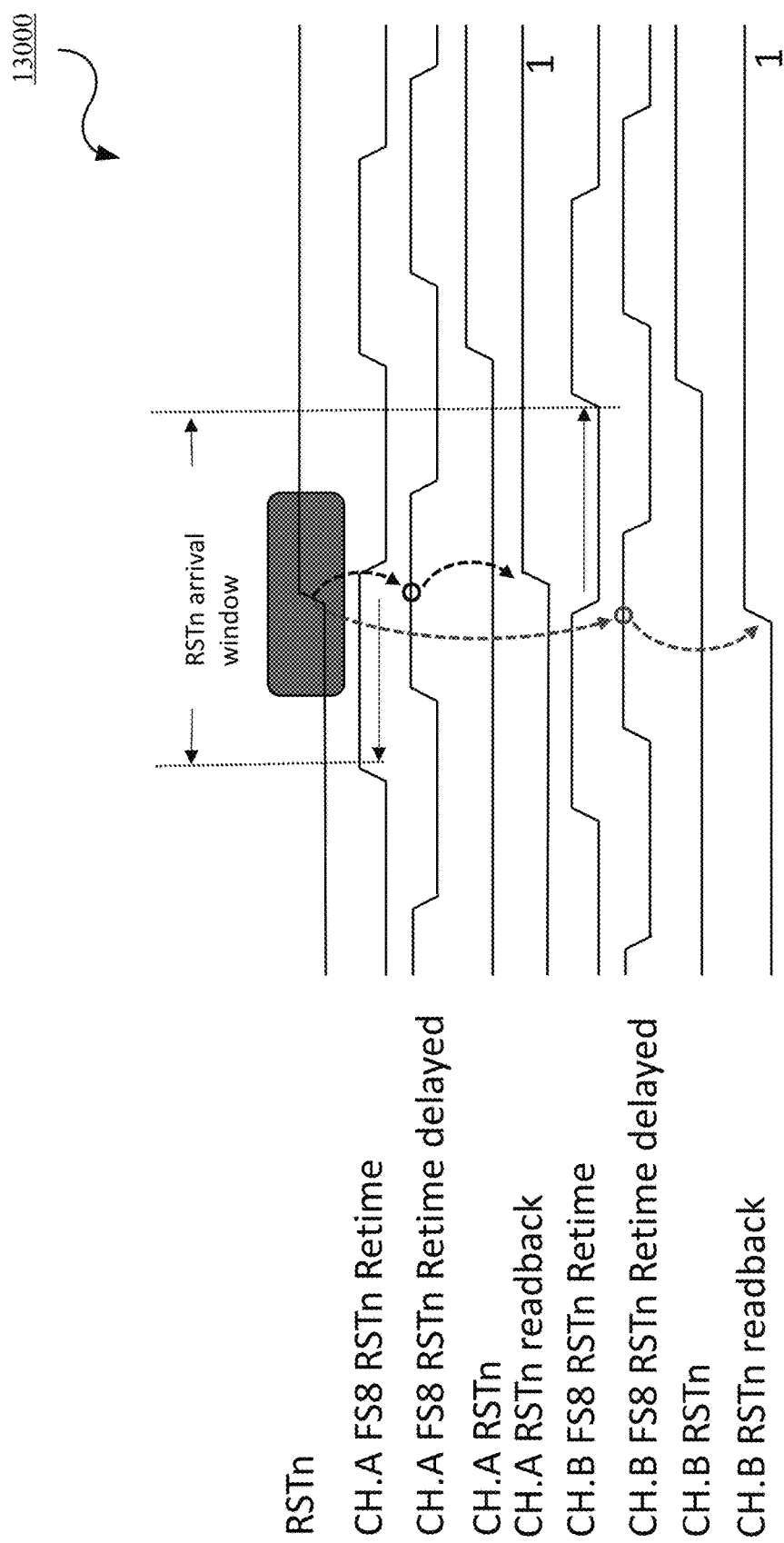
FIG. 13 is a diagram of a readback functionality in accordance with embodiments of this disclosure.

FIG. 13 is a diagram 13000 of a readback functionality in accordance with embodiments of this disclosure. In this instance, the sampling of the CH. A FS8 RSTn Retime delayed results in a readback value of 1 and the sampling of the CH. B FS8 RSTn Retime delayed results in a readback value of 1. Accordingly, the phase or delay setting is correct.

Figure 14:
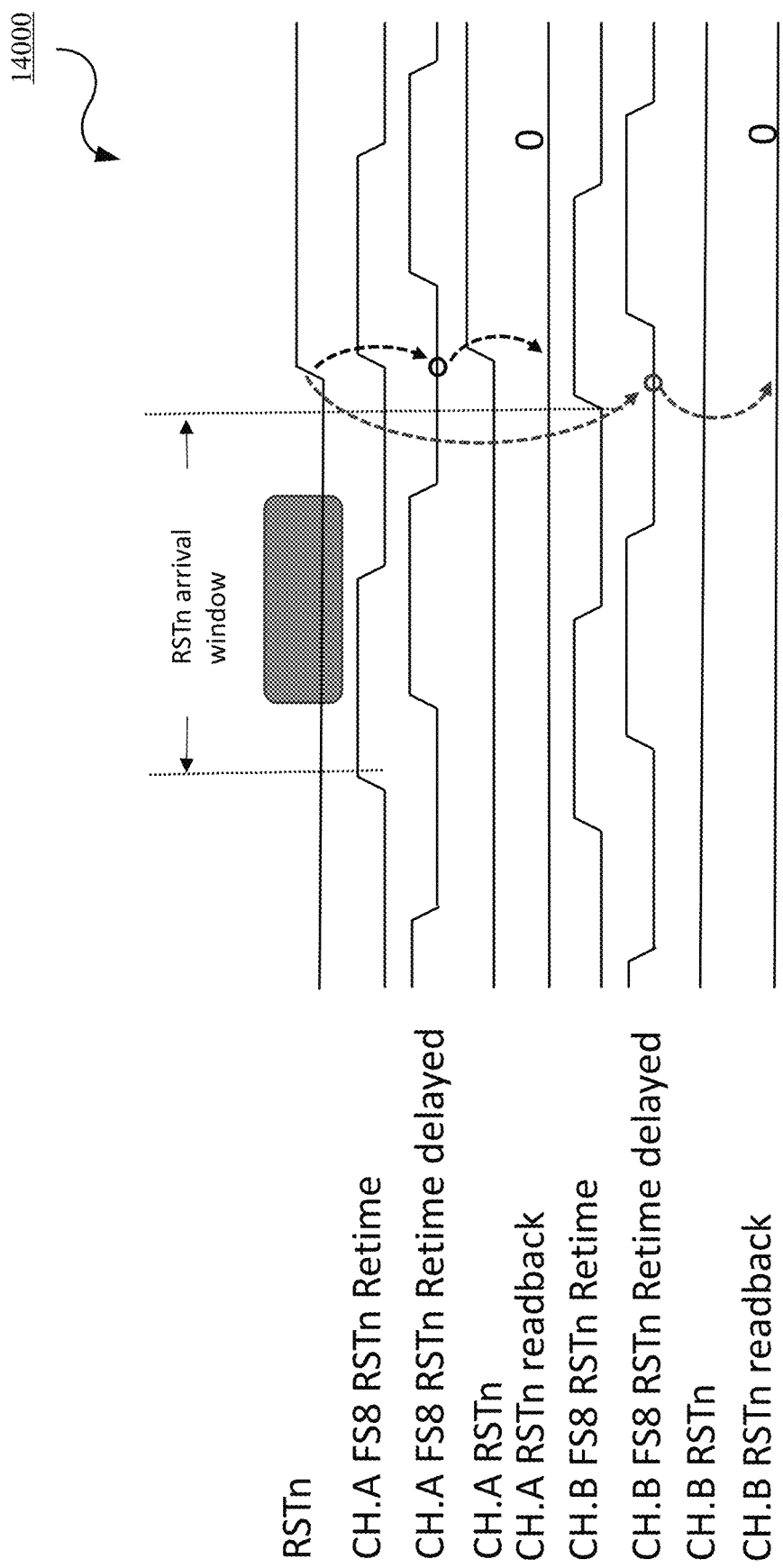
FIG. 14 is a diagram of a readback functionality in accordance with embodiments of this disclosure.

FIG. 14 is a diagram 14000 of a readback functionality in accordance with embodiments of this disclosure. In this instance, the sampling of the CH. A FS8 RSTn Retime delayed results in a readback value of 0 and the sampling of the CH. B FS8 RSTn Retime delayed results in a readback value of 0. Accordingly, the phase or delay setting is incorrect.

Figure 15:
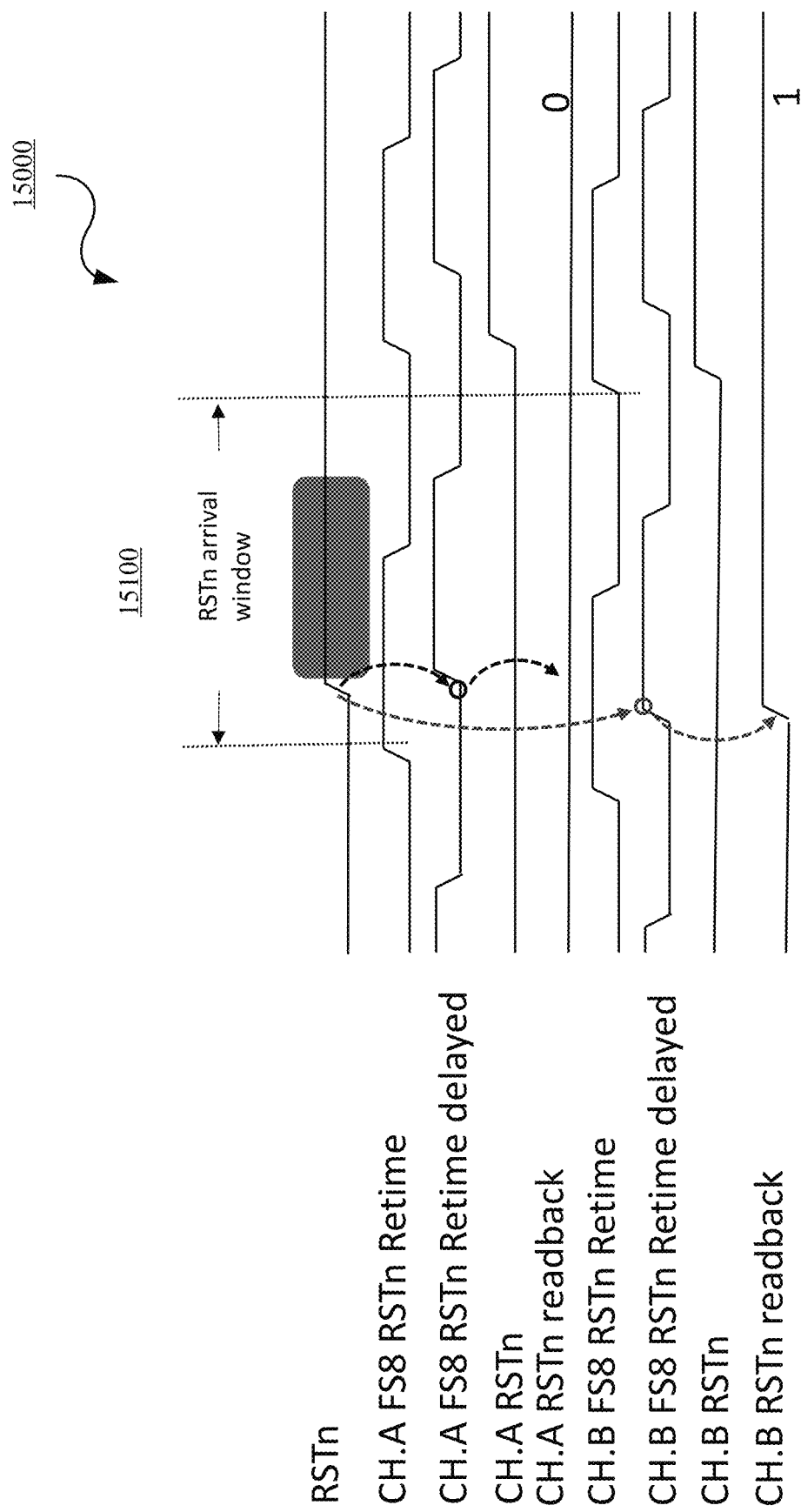
FIG. 15 is a diagram of a readback functionality in accordance with embodiments of this disclosure.

FIG. 15 is a diagram of a readback functionality in accordance with embodiments of this disclosure. In this instance, the sampling of the CH. A FS8 RSTn Retime delayed results in a readback value of 0 and the sampling of the CH. B FS8 RSTn Retime delayed results in a readback value of 1. Noting that an optimal arrival window 15100 is conservative, the phase or delay setting is correct and the self-calibrating circuit reports a false negative.

Figure 16:
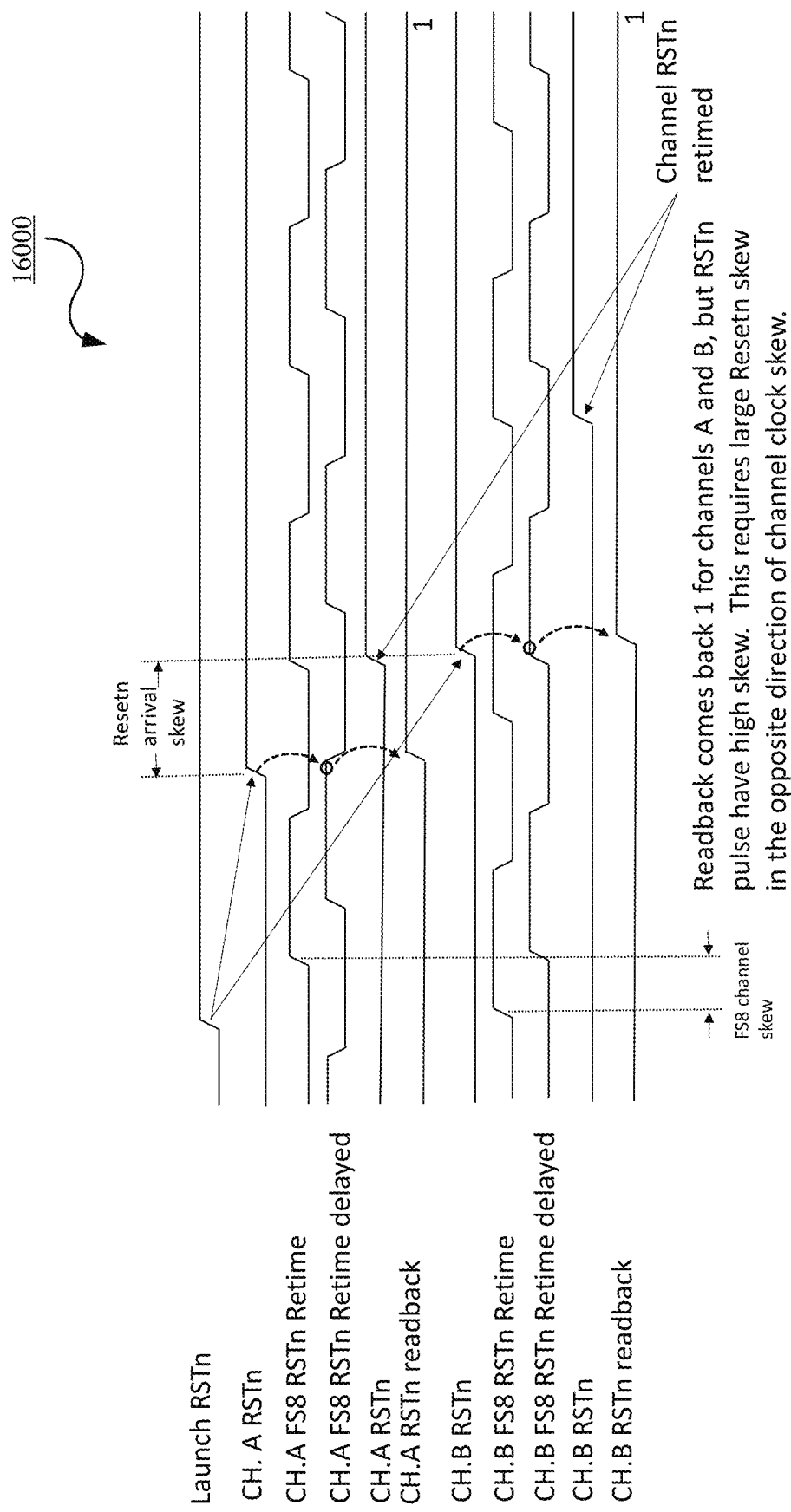
FIG. 16 is a diagram of a readback functionality in accordance with embodiments of this disclosure.

FIG. 16 is a diagram of a readback functionality in accordance with embodiments of this disclosure. In this instance, the sampling of the CH. A FS8 RSTn Retime delayed results in a readback value of 1 and the sampling of the CH. B FS8 RSTn Retime delayed results in a readback value of 1. However, the RSTn pulse is highly skewed, for example, over 50 ps skew. This resulting in the CH. A RSTn retimed and the CH. B RSTm retimed being misaligned.

Figure 17:
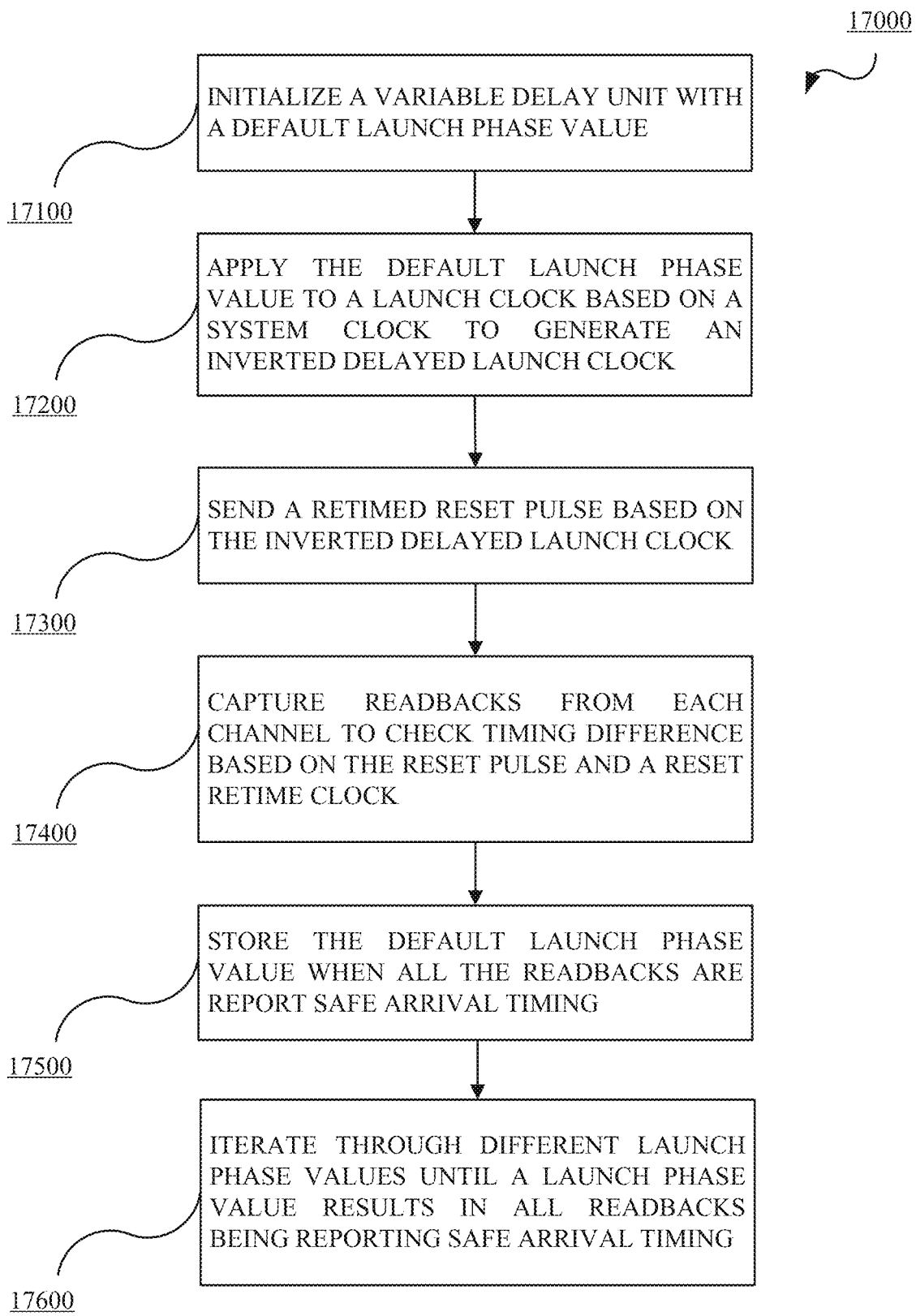
FIG. 17 is a flowchart of an example technique for clock alignment for high-speed clock domains in accordance with embodiments of this disclosure.

FIG. 17 is a flowchart of an example method 17000 for multi-channel alignment in accordance with embodiments of this disclosure. The method 17000 includes: initializing 17100 a variable delay unit with a default launch phase value; applying 17200 the default launch phase value to a launch clock based on a system clock to generate an inverted delayed launch clock; sending 17300 a retimed reset pulse based on the inverted delayed launch clock; capturing 17400 readbacks from each channel to check timing difference based on the reset pulse and a reset retime clock; storing 17500 the default launch phase value when all the readbacks are report safe arrival timing; and iterating 17600 through different launch phase values until a launch phase value results in all readbacks being reporting safe arrival timing. The method 17000 can be implemented by the high-speed multi-channel circuit 3000, the high-speed multi-channel circuit 4000, the reset launch circuit 6000, the reset launch circuit 7000, and the receive retiming circuit 8000, as appropriate and applicable.

The method 17000 includes initializing 17100 a variable delay unit with a default launch phase value. Upon start-up of a high-speed multi-channel device, the variable delay unit is set to a default launch phase value. The variable delay unit controls the timing or phase of when an asynchronously received reset pulse is transmitted.

The method 17000 includes applying 17200 the default launch phase value to a launch clock based on a system clock to generate a logic inverted delayed launch clock. The reset pulse is asynchronously received and is not synchronous with the system clock. The launch clock is used to synchronize the reset pulse with the system clock domain.

The launch phase values are applied to the launch clock to control when the reset pulse is sent.

The method 17000 includes sending 17300 a reset pulse based on the logic inverted delayed launch clock. The reset pulse is retimed and sent via the reset clock tree which is configured to match a main clock tree.

The method 17000 includes capturing 17400 readbacks from each channel to check timing differences based on the retimed reset pulse and a reset retime clock. An arbiter samples the reset retime clock, which is based on the system clock, with the retimed reset pulse. The arbiter reports a logic level of the sampled reset retime clock.

The method 17000 includes storing 17500 the default launch phase value when all the readbacks report safe arrival timing as described herein. If all the readbacks are at an expected logic value then the default launch phase value is stored.

The method 17000 includes iterating 17600 through different launch phase values until a launch phase value results in all readbacks reporting safe arrival timing.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A high-speed multi-channel device comprising:
multiple processing channels, each channel including
a divider configured to divide down a frequency clock from a frequency clock bus; and
a reset unit configured to reset the divider, a clock input of the reset unit connected to a reset retime clock from the frequency clock bus;
a reset launch circuit configured to
receive a reset pulse;
receive a reset launch clock from one of the multiple processing channels, the reset launch clock configured to make coherent the reset pulse and the reset retime clock;
apply a launch phase value to the reset launch clock to generate a delayed reset launch clock, the launch phase value configured to control a launching of the reset pulse; and
launch the reset pulse based on the delayed reset launch clock; and
multiple arbiters, one for each channel of the multiple processing channels, each arbiter configured to send a readback signal based on sampling a reset retime delayed clock using the launched reset pulse,
wherein the reset launch clock and the multiple arbiters iterate through launch phase values until readback signals from each of the multiple arbiters reports safe arrival timing of the launched reset pulse at a respective reset unit.

2. The high-speed multi-channel device of claim 1, wherein the reset launch circuit includes a variable delay unit configured to apply a selected launch phase value to the reset launch clock.

3. The high-speed multi-channel device of claim 1, wherein the multiple arbiters each send the readback to a control unit.

4. The high-speed multi-channel device of claim 1, wherein the reset launch circuit includes a variable delay unit configured to receive a launch phase value selection signal from a control unit based on processing the readback signals.

5. The high-speed multi-channel device of claim 4, wherein the reset launch circuit includes a reset launch unit connected to the variable delay unit, the reset launch unit configured to launch the reset pulse.

6. The high-speed multi-channel device of claim 1, further comprising
a sample scope circuit configured to obtain samples at an input and at a clock input of the reset unit for each channel, the samples determinative of whether the launching of the reset pulse is close to a sensitive edge of the reset retime clock.

7. The high-speed multi-channel device of claim 1, wherein the safe arrival timing indicates that the launching of the reset pulse is close to a sensitive edge of the reset retime clock.

8. The high-speed multi-channel device of claim 1, wherein unsafe arrival timing accounts for channel to channel frequency clock skew and setup and hold time.

9. The high-speed multi-channel device of claim 8, wherein the unsafe arrival timing uses a two-fold factor to establish an optimal timing margin.

10. The high-speed multi-channel device of claim 1, wherein each channel represents a different clock domain and the reset pulse is incoherent with respect to each different clock domain.

11. A method for clock domain alignment in a multi-channel device, the method comprising:
initializing a variable delay unit with a default launch phase value to control a launching of a reset pulse;
applying the default launch phase value to a launch clock to generate a delayed launch clock, wherein the launch clock synchronizes the reset pulse with a system clock;
sending the reset pulse based on the delayed launch clock;
for each channel, capturing a readback to check a timing difference based on the reset pulse and a reset retime clock;
storing the default launch phase value when all readbacks indicate safe arrival timing signifying channel alignment; and
iterating through different launch phase values until a launch phase value results in all readbacks indicating safe arrival timing.

12. The method of claim 11, further comprising
sampling a reset retime delayed clock using the reset pulse to generate the readback, wherein a reset time clock aligns a divider in a channel with other dividers in other channels when all readbacks indicate safe arrival timing.

13. The method of claim 11, further comprising
sending each readback to a controller for analysis.

14. The method of claim 13, further comprising
receiving launch phase value selections based on analyzed redbacks.

15. The method of claim 11, further comprising
controlling a common-mode voltage by switching on/off resistors in a resistor ladder to change a duty cycle of the synthesized frequency clock.

16. The method of claim 11, wherein the safe arrival timing indicates that the launching of the reset pulse is close to a sensitive edge of the reset retime clock.

17. The method of claim 11, wherein an optimal timing margin is established by using a two-fold factor to account for channel to channel frequency clock skew and setup and hold time.

18. A system comprising:
at least two clock domains, each clock domain including a resettable device having a local reset retime clock;
a launch circuit connected to each of the at least two domains, the launch circuit configured to
align a reset pulse with the local reset retime clock by using a launch clock from one of the at least two domains, wherein the reset pulse is incoherent with respect to the at least two clock domains;
adjust a delay of the launch clock to control a launch time of the reset pulse, the delay provided by a digital core; and
send the reset pulse based on the delayed launch clock; and
a calibration circuit configured to sample a local reset retime delayed clock to generate a readback signal,
wherein the launch circuit and the calibration circuit iterate through selected delays until safe arrival timing is indicated from each readout.

19. The system of claim 18, wherein the safe arrival timing indicates that the launching of the reset pulse is close to a sensitive edge of the local reset retime clock.

20. The system of claim 18, further comprising
a sample scope circuit configured to obtain samples from each clock domain, the samples determinative of whether the launching of the reset pulse is close to a sensitive edge of the local reset retime clock.

* * * * *